(12) United States Patent  
Chang et al.

(10) Patent No.: US 9,356,021 B2  
(45) Date of Patent: *May 31, 2016

(54) SELF-ALIGNMENT FOR TWO OR MORE LAYERS AND METHODS OF FORMING SAME

(71) Applicant: Taiwan Semiconductor Manufacturing Company, Ltd., Hsin-Chu (TW)

(72) Inventors: Shih-Ming Chang, Zhubei (TW); Ru-Gun Liu, Zhubei (TW); Ken-Hsien Hsieh, Taipei (TW); Ming-Feng Shieh, Yongkang (TW); Chih-Ming Lai, Hsin-Chu (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,801

(22) Filed: Feb. 23, 2015

(65) Prior Publication Data

US 2015/0171081 A1    Jun. 18, 2015

Related U.S. Application Data

(63) Continuation of application No. 14/030,601, filed on Sep. 18, 2013, now Pat. No. 8,962,464.

(51) Int. Cl.

| | |
|---|---|
| *H01L 21/3205* | (2006.01) |
| *H01L 27/088* | (2006.01) |
| *H01L 21/768* | (2006.01) |
| *H01L 21/28* | (2006.01) |
| *H01L 21/3105* | (2006.01) |
| *H01L 21/8234* | (2006.01) |

(52) U.S. Cl.

CPC ........ *H01L 27/088* (2013.01); *H01L 21/28123* (2013.01); *H01L 21/31053* (2013.01); *H01L 21/76816* (2013.01); *H01L 21/76897* (2013.01); *H01L 21/823437* (2013.01); *H01L 21/823475* (2013.01)

(58) Field of Classification Search

CPC ............ H01L 27/088; H01L 21/28123; H01L 21/31053; H01L 21/76897; H01L 21/823437; H01L 21/823475

USPC ................. 438/586, 588, 622, 637, 638, 640; 257/410, 750, 773, 774, 775

See application file for complete search history.

(56) References Cited

U.S. PATENT DOCUMENTS

| | | | |
|---|---|---|---|
| 7,772,702 B2 | 8/2010 | Bielefeld et al. | |
| 8,679,965 B2 | 3/2014 | Park | |
| 8,962,464 B1 * | 2/2015 | Chang ............... | H01L 21/76897 438/588 |
| 2004/0266167 A1 | 12/2004 | Dubin et al. | |
| 2007/0257368 A1 | 11/2007 | Hussein et al. | |
| 2008/0191355 A1 | 8/2008 | Park | |

* cited by examiner

*Primary Examiner* — Kevin M Picardat

(74) *Attorney, Agent, or Firm* — Slater Matsil, LLP

(57) ABSTRACT

Embodiments of the present disclosure include self-alignment of two or more layers and methods of forming the same. An embodiment is a method for forming a semiconductor device including forming at least two gates over a substrate, forming at least two alignment structures over the at least two gates, forming spacers on the at least two alignment structures, and forming a first opening between a pair of the at least two alignment structures, the first opening extending a first distance from a top surface of the substrate. The method further includes filling the first opening with a first conductive material, forming a second opening between the spacers of at least one of the at least two alignment structures, the second opening extending a second distance from the top surface of the substrate, and filling the second opening with a second conductive material.

20 Claims, 42 Drawing Sheets

SELF-ALIGNMENT FOR TWO OR MORE LAYERS AND METHODS OF FORMING SAME

This application is a continuation of U.S. patent application Ser. No. 14/030,601, filed Sep. 18, 2013, entitled "Self-Alignment for using Two or More Layers and Methods of Forming Same," which application is hereby incorporated herein by reference in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

In particular, as designs shrink, conductive features connecting to layers above and below may become shorted if the conductive feature is misaligned. Generally, this occurs when the etching process through the layer is misaligned such that the conductive feature exposes portions of an adjacent conductive feature on the layer below.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
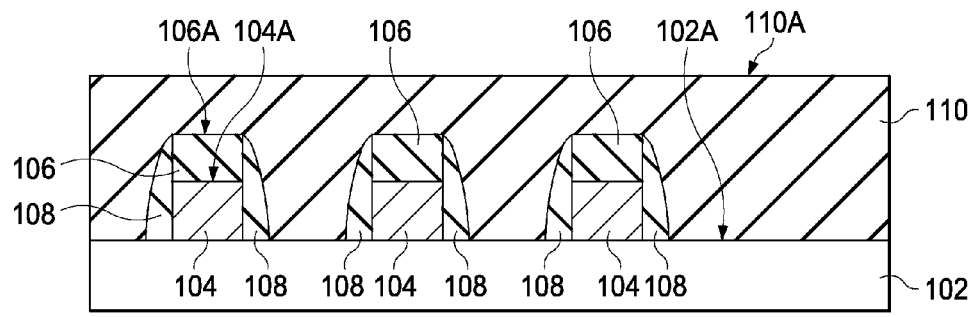
FIGS. 1A through 1N illustrate cross-sectional views of intermediate stages in the manufacturing of a semiconductor device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a self-alignment scheme between two layers. Other embodiments may also be applied, however, to align three or more layers.

Figure 1B:
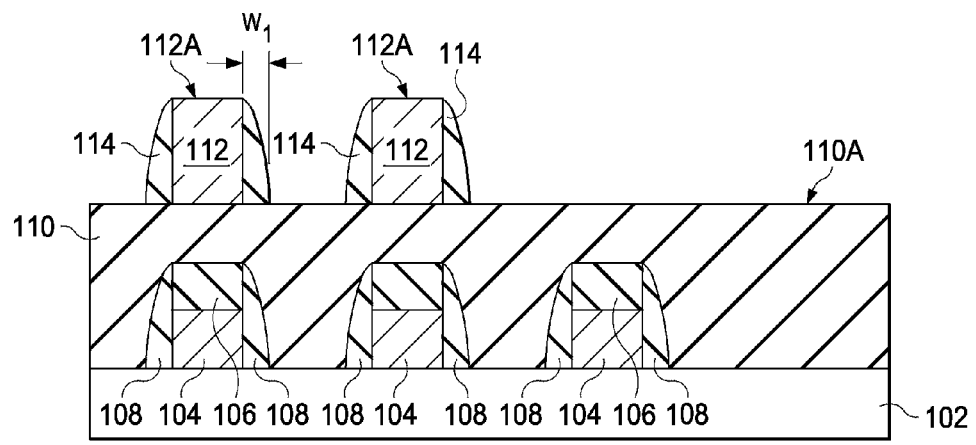
Figure 1C:
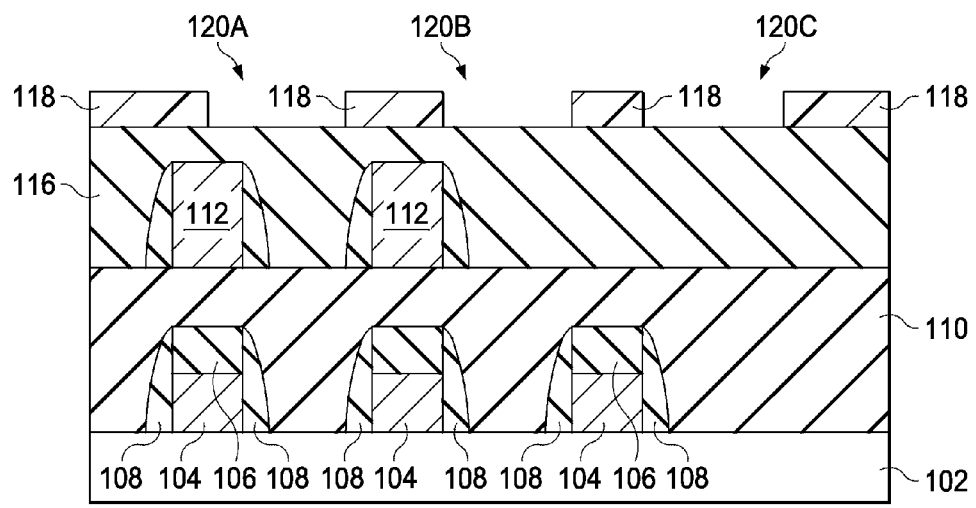
Figure 1D:
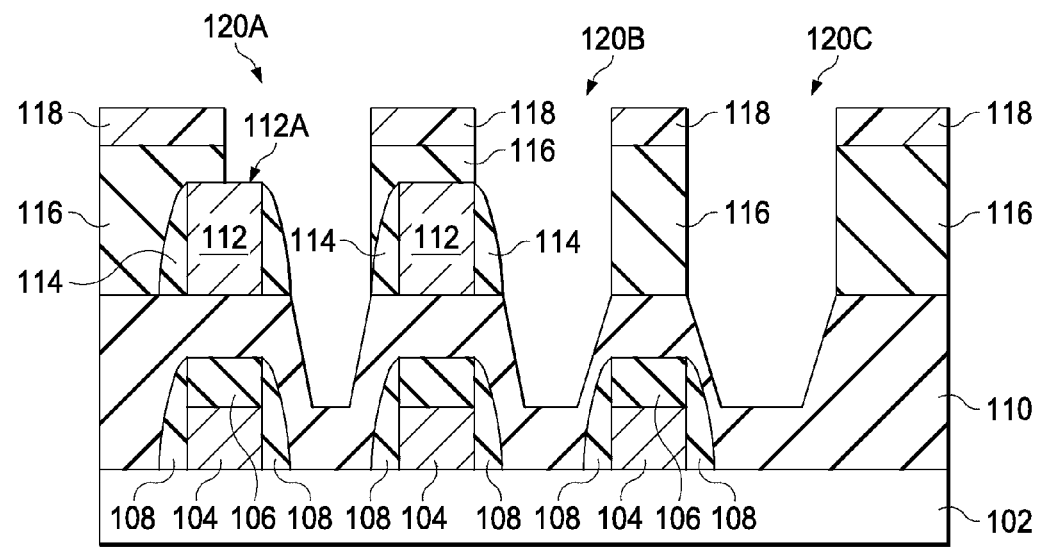
Figure 1E:
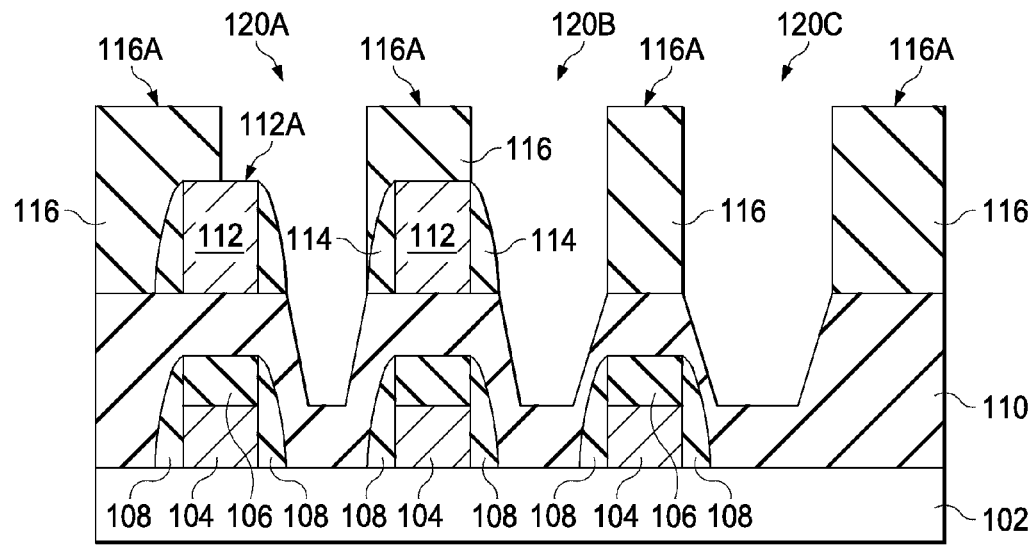
Figure 1F:
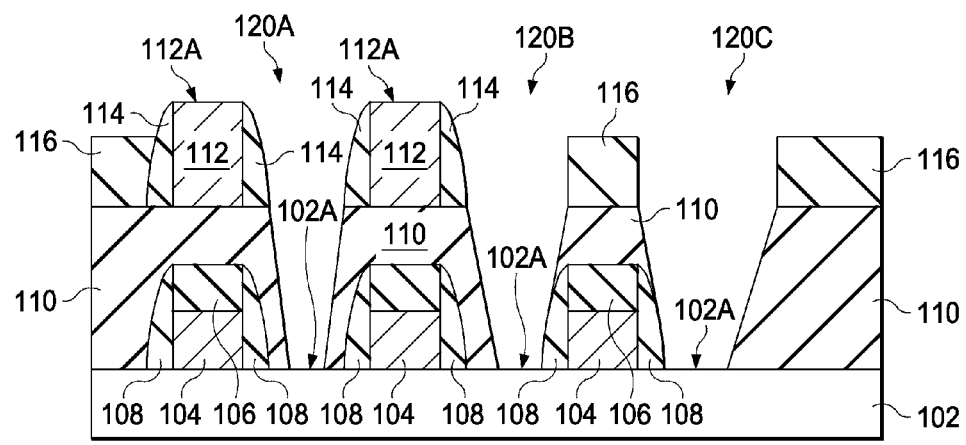
Figure 1G:
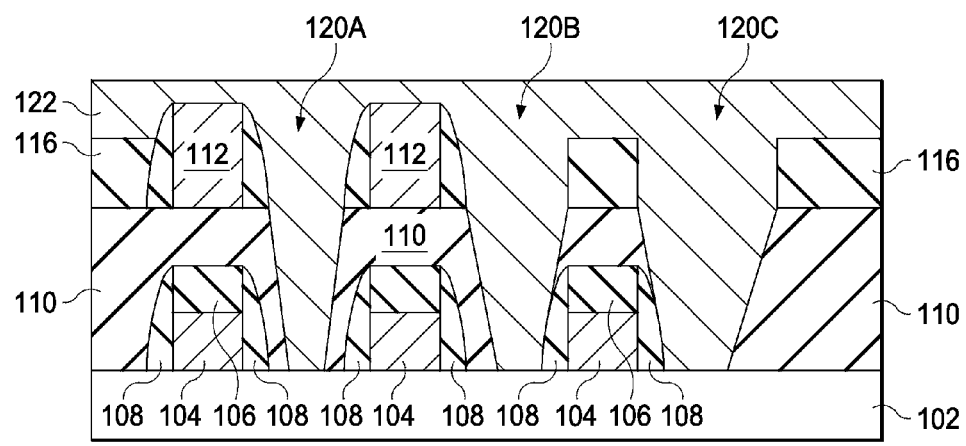
Figure 1H:
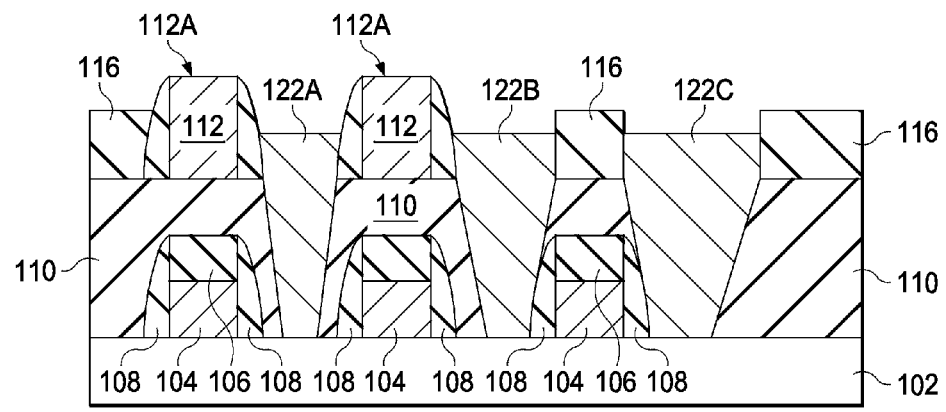
Figure 1I:
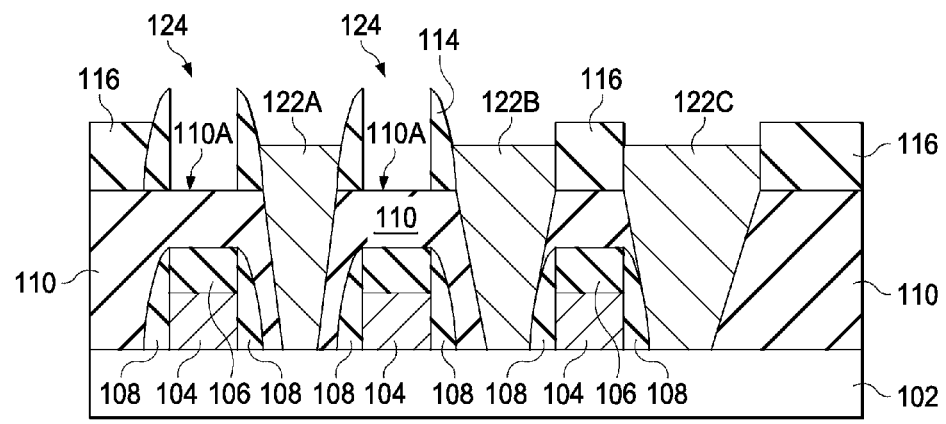
Figure 1J:
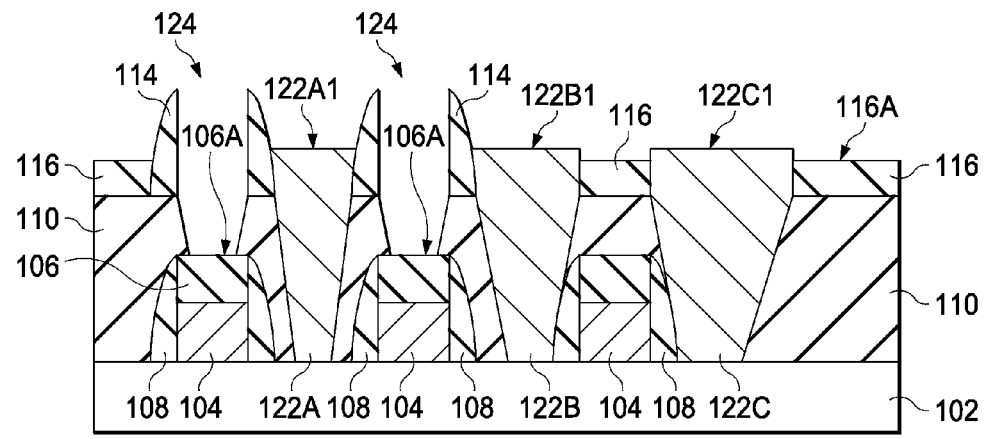
Figure 1K:
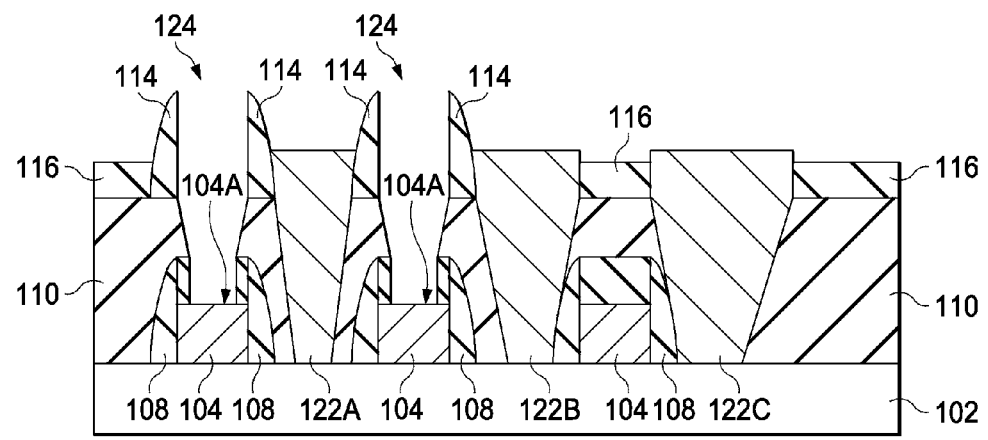
Figure 1L:
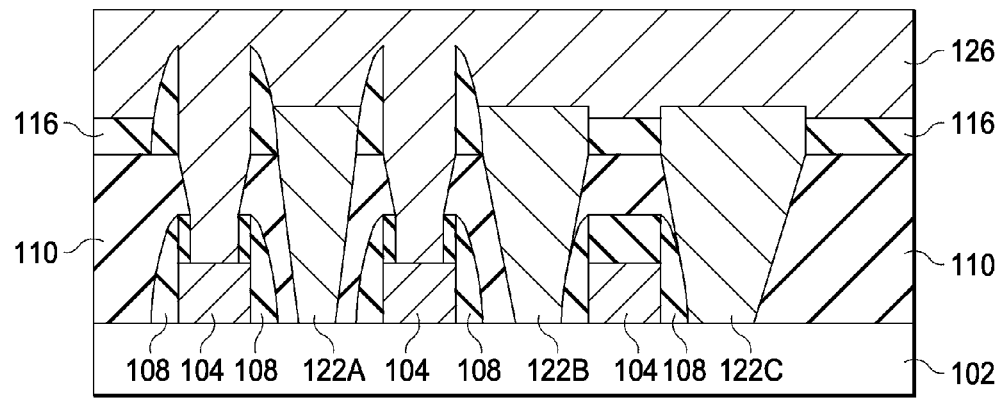
Figure 1M:
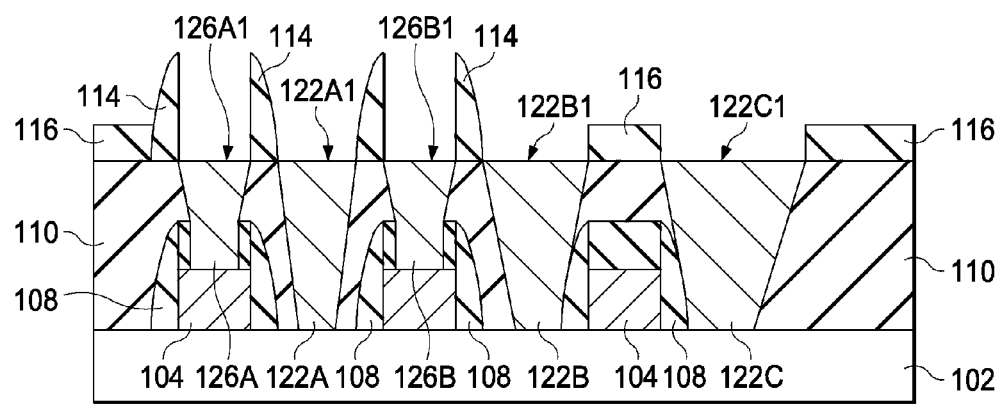
Figure 1N:
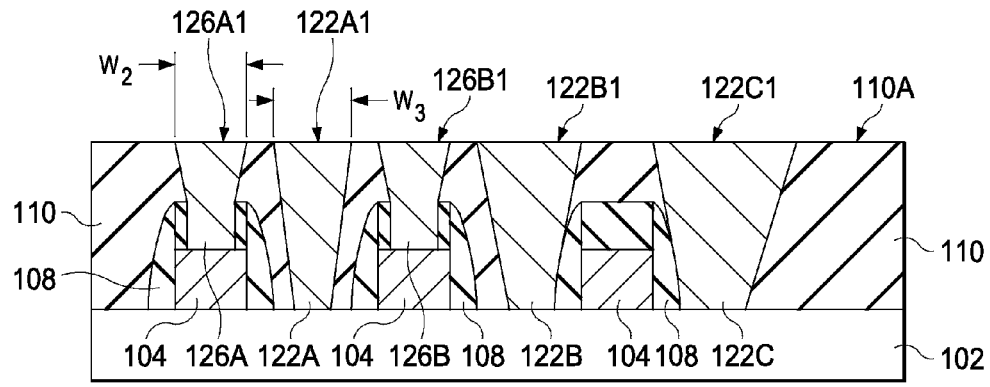

FIGS. 1A through 1N illustrate cross-sectional views of intermediate stages in the manufacturing of a semiconductor device in accordance with an embodiment. FIG. 1A illustrates a semiconductor device includes a substrate 102, gates 104, hard masks 106 on the gates 104, gate spacers 108 on the sidewalls of the gates 104, and an inter-layer dielectric (ILD) 110 over the gates 104, the hard masks 106, and the gate spacers 108. The substrate 102 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof.

The substrate 102 may include active and passive devices (not shown in FIG. 1A). As one of ordinary skill in the art will recognize, a wide variety of devices such as transistors, capacitors, resistors, combinations of these, and the like may be used to generate the structural and functional requirements of the semiconductor device. The devices may be formed using any suitable methods. Only a portion of the substrate 102 is illustrated in the figures, as this is sufficient to fully describe the illustrative embodiments.

The substrate 102 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

The gates 104 are formed over the substrate 102. The gates 104 may include a gate dielectric layer (not shown), a hard mask 106, and gate spacers 108. The gate dielectric layer may be formed by thermal oxidation, chemical vapor deposition (CVD), sputtering, or any other methods known and used in the art for forming a gate dielectric. In some embodiments, the gate dielectric layer includes dielectric materials having a high dielectric constant (k value), for example, greater than 3.9. The gate dielectric materials include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer (not shown) may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. In one embodiment, amorphous silicon is deposited and recrystallized to create polycrystalline silicon (poly-silicon). The gate electrode layer may be deposited by physical vapor deposition (PVD), CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques.

A hard mask layer (not shown) is formed over the gate electrode layer. The hard mask layer may be made of SiN, SiON, $SiO_2$ the like, or a combination thereof. The hard mask layer is then patterned. The patterning of the hard mask layer may be accomplished by depositing mask material (not shown) such as photoresist over the hard mask layer. The mask material is then patterned and the hard mask layer is etched in accordance with the pattern to form hard masks 106. The gate electrode layer and the gate dielectric layer may be patterned to form the gates 104. The gate patterning process may be accomplished by using the hard mask 106 as a pattern and etching the gate electrode layer and the gate dielectric layer to form the gates 104.

The gate spacers 108 are formed on opposite sides of the gates 104. The gate spacers 108 are formed by blanket depositing a spacer layer (not shown) on the previously formed gates 104 and hard masks 106. In an embodiment, the gate spacers 108 include a spacer liner (not shown). The spacer liner may be made of SiN, SiC, SiGe, oxynitride, oxide, the like, or a combination thereof. The spacer layer may comprise SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, the like, or a combination thereof. The gate spacers 108 are then patterned, for example, by an anisotropic etch to remove the spacer layer from top surfaces 106A of the hard masks 106.

Although the description above described the formation of a gate 104, the structure 104 is not limited to a gate. In some embodiments, the structure 104 is a conductive line 104 that is to be aligned and coupled with another conductive feature by the subsequently formed conductive feature 126 (see FIG. 1N).

After the gates 104, hard masks 106, and gate spacers 108 are formed, the ILD 110 is formed over these structures and the substrate 102. The ILD 110 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 110 may be deposited by CVD, PVD, ALD, a spin-on-dielectric (SOD) process, the like, or a combination thereof. In an embodiment, the ILD 24 is formed directly on a top surface 102A of the substrate 102. In other embodiments, the ILD 110 is formed on intermediate layers and/or structures (not shown) which are on substrate 102. In some embodiments, the ILD 110 is planarized by a chemical mechanical polish (CMP) process or an etching process to form a substantially planar top surface 110A.

FIG. 1B illustrates the formation of alignment structures 112 and alignment spacers 114 on the top surface 110A of the ILD 110. The alignment structures 112 and the spacers 114 may be formed of similar materials and by similar processes as the gates 104 and the spacers 108, respectively, and the descriptions will not be repeated herein, although the materials and processes need not be the same. In an embodiment, each of the alignment structures 112 is aligned with a gate 104 in the layer below the respective alignment structure 112. In some embodiments, the alignment spacers 114 are formed to have a width $W_1$ in a range from about 10% to about 40% of a minimum space between adjacent alignment structures 112.

FIG. 1C illustrates the formation of an ILD 116 and a patterning layer 118 over the ILD 110. The ILD 116 is formed over the alignment structures 112 and the alignment spacers 114 and on the ILD 110. The ILD 116 may be formed of similar materials and by similar processes as the ILD 110 and the description will not be repeated herein, although the ILD 116 and the ILD 110 need not be the same.

The patterning layer 118 is formed and patterned over the ILD 116. In an embodiment, the patterning layer 118 is formed of a photoresist material, such as a deep ultraviolet (DUV) photoresist, an extreme ultraviolet (EUV) photoresist, an electron beam direct write (EBDW) photoresist, or the like, and is deposited on the surface of the ILD 116 by using a spin-on process to place the patterning layer 118. However, any other suitable material or method of forming or placing a photoresist material may alternatively be utilized. In this embodiment, once the patterning layer 118 has been placed on the ILD 116, the patterning layer 118 is exposed to energy, e.g. light, through a patterned reticle in order to induce a reaction in those portions of the patterning layer 118 exposed to the energy. The patterning layer 118 is then developed, and portions of the patterning layer 118 are removed forming openings 120A, 120B, and 120C, exposing a top surface 116A of the ILD 116 through the openings 120A, 120B, and 120C. In another embodiment, the patterning layer 118 is a hard mask. In this embodiment, the patterning layer 118 is formed of and by similar processes as the hard masks 106, and the details will not be repeated herein, although the patterning layer 118 and the hard masks 106 need not be the same.

FIG. 1D illustrates the formation of the openings 120A, 120B, and 120C through the ILD 116 and partially through the ILD 110. Although a portion of the opening 120A extends over a top surface 112A of the alignment structure 112, the alignment structure 112 and the alignment spacers 114 self-align the opening 120 between a pair of the adjacent gates 104. The opening 120B is self-aligned by another spacer 114 to be between a pair of adjacent gates 104. The opening 120C does not require an alignment by an alignment structure 112 or alignment spacer 114. The openings 120A, 120B, and 120C may be formed by using acceptable etching techniques. In an embodiment, the openings 120A, 120B, and 120C are formed by an anisotropic dry etch.

FIG. 1E illustrates the removal of the patterning layer 118 to expose the top surface 116A of the ILD 116. The patterning layer 118 may be removed by a CMP process, an etch process, the like, or a combination thereof.

FIG. 1F illustrates forming the openings 120A, 120B, and 120C through the remaining portion of the ILD 110 to expose portions of the top surface 102A of the substrate 102. The opening 120A is formed between a pair of alignment structures 112 with their respective alignment spacers 114 and a pair of gates 104 with their gate spacers 108. The opening 120B is formed between an alignment structure 112 with its respective alignment spacer 114 and a patterned portion of ILD 116 and between a pair of gates 104 with their respective gate spacers 108. The opening 120C is formed between patterned portions of ILD 116 and between a gate 104 with its respective gate spacer 108 and a portion of patterned ILD 110. In an embodiment, the openings 120A, 120B, and 120C are extended through ILD 110 by using an anisotropic dry etch.

FIG. 1G illustrates the formation of a conductive layer 122 in the openings 120A, 120B, and 120C contacting the top surface 102A of the substrate 102 and along top surfaces 116A of the ILD 116, top surfaces 112A of the alignment structures 112, and alignment spacers 114. In some embodiments, the conductive layer 122 includes a barrier layer (not shown). The barrier layer helps to block diffusion of the subsequently formed conductive layer 122 into adjacent dielectric materials such as ILD 110. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer may be formed by CVD, PVD, plasma enhanced CVD (PECVD), ALD, SOD, the like, or a combination thereof. In some embodiments, the barrier layer is omitted.

The conductive layer 122 may be made of tungsten, copper, aluminum, the like, or a combination thereof. The conductive layer 122 may be formed through a deposition process such as electrochemical plating, PVD, CVD, the like, or a combination thereof. In some embodiments, the conductive layer 122 is formed on a copper seed layer.

FIG. 1H illustrates the recessing of the conductive layer 122 to form conductive features 122A, 122B, and 122C in the openings 120A, 120B, and 120C, respectively. In some embodiments, the top surfaces 122A1, 122B1, and 122C1 of the conductive features 122A, 122B, and 122C, respectively, is below the top surface 112A of the alignment structure 112 and the top surface 116A of the ILD 116 after the recessing. In an embodiment, the recessing is performed by a dry etch process with a plasma source and an etchant gas such as $CF_4$, $SF_6$, the like, or a combination thereof.

FIG. 1I illustrates the formation of openings 124 by removing the alignment structures 112 from between the alignment spacers 114 to expose the top surface 110A of the ILD 110. The alignment structures 112 may be removed by an etch process, such as a wet etch process, that is selective to the alignment structures 112.

FIG. 1J illustrates extending the openings 124 through the ILD 110 to expose the top surfaces 106A of the hard masks 106. The openings 124 may be extended through the ILD 110 by using acceptable etching techniques such as, for example, an anisotropic dry etch.

FIG. 1K illustrates extending the openings 124 through the hard masks 106 to expose top surfaces 104A of the gates 104. The openings 124 may be extended through the hard masks 106 by using acceptable etching techniques such as, for example, an anisotropic dry etch.

FIG. 1L illustrates the formation of a conductive layer 126 in the openings 124 contacting the top surface 104A of the gates 104 and over the conductive features 122A, 122B, and 122C. The conductive layer 126 may be formed of similar materials and by similar processes as the conductive layer 122 discussed above and the description will not be repeated herein, although the conductive layers 122 and 126 need not be the same.

FIG. 1M illustrates the recessing of the conductive layer 126 to form conductive features 126A and 126B in the openings 124 and the recessing of the conductive features 122A, 122B, and 122C. In some embodiments, the top surfaces 126A1 and 126B1 of the conductive features 126A and 126B, respectively, and the top surfaces 122A1, 122B1, and 122C1 of the conductive features 122A, 122B, and 122C, respectively, are substantially coplanar after the recessing. In an embodiment, the recessing is performed by a dry etch process that etches conductive layer 126 conductive features 122A, 122B, and 122C with a plasma source and an etchant gas such as $CF_4$, $SF_6$, the like, or a combination thereof.

FIG. 1N illustrates the removal of the alignment spacers 114 and the remaining portions of ILD 116 and the planarization of the ILD 110, conductive features 126A, 126B, 122A, 122B, and 122C. The planarization process may be a CMP process, an etch process, the like, or a combination thereof. In some embodiments, the top surfaces 126A1 and 126B1 of the conductive features 126A and 126B, respectively, the top surfaces 122A1, 122B1, and 122C1 of the conductive features 122A, 122B, and 122C, respectively, and the top surface 110A of the ILD 110 are substantially coplanar after the planarization process. In an embodiment, the conductive features 126 (126A and 126B) are formed to have a width $W_2$ in a range from about 50% to about 150% of a width of the gate 104 below the respective conductive feature 126. In an embodiment, the conductive features 122 (122A, 122B, and 122C) are formed to have a width $W_3$ in a range from about 50% to about 150% of a width between adjacent gates 104. In some embodiments where the gates 104 are gate electrodes, the conductive features 126A and 126B are used as contacts to couple the gates 104 to layers above the ILD 110 and the conductive features 122A, 122B, and 122C are used as contacts to couple the substrate 102 and devices and layers (e.g. source/drain features) formed therein to layers above ILD 110. In other embodiments where the structure 104 is a conductive line 104, the conductive features 126 and 126B are used to couple the conductive line 104 to another conductive feature above the ILD 110 and the conductive features 122A, 122B, and 122C are used as contacts to couple the substrate 102 and devices and metallization layers formed therein to layers above ILD 110.

By having only spacers surrounding the gates in the ILD layer, the ILD layer is able to be kept clean and free from residue from other spacers and/or hard masks as the alignment structures are formed in ILD layer above the ILD layer containing the gates. Further, the process described above allows line patterns (e.g. alignment structure 112) to self-align to another line pattern (e.g. gate 104).

FIGS. 2A through 2G illustrate cross-sectional views of intermediate stages in the manufacturing of a semiconductor device in accordance with an embodiment. Details regarding this embodiment that are similar to those for the previously described embodiment will not be repeated herein.

Figure 2A:
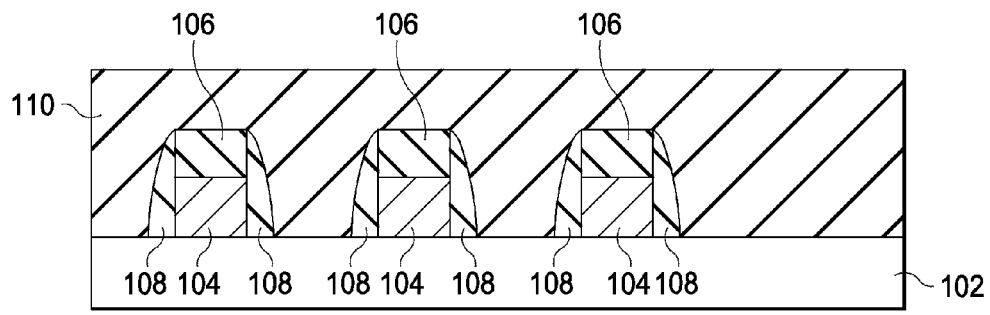
FIGS. 2A through 2G illustrate cross-sectional views of intermediate stages in the manufacturing of a semiconductor device in accordance with an embodiment.
Figure 2B:
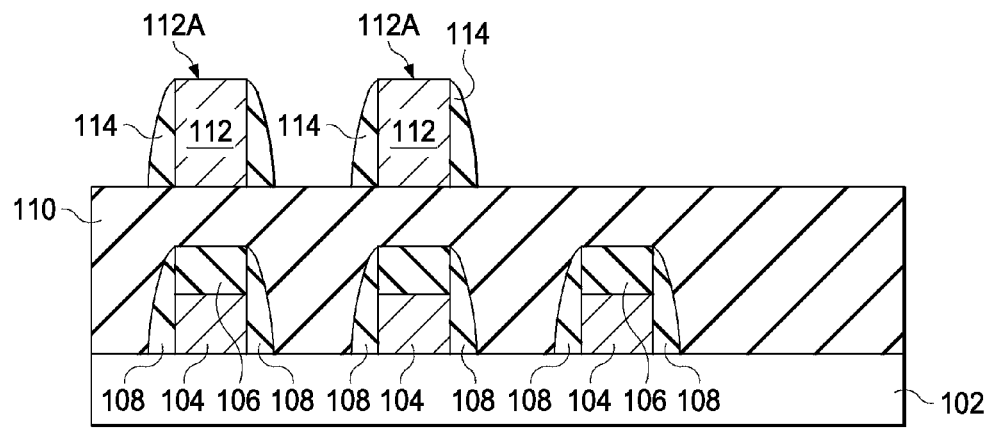
Figure 2C:
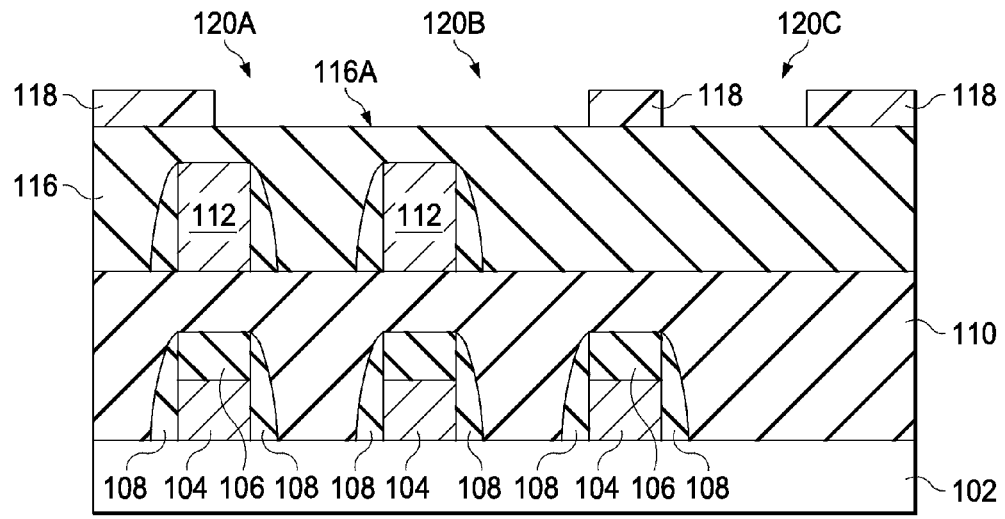
Figure 2D:
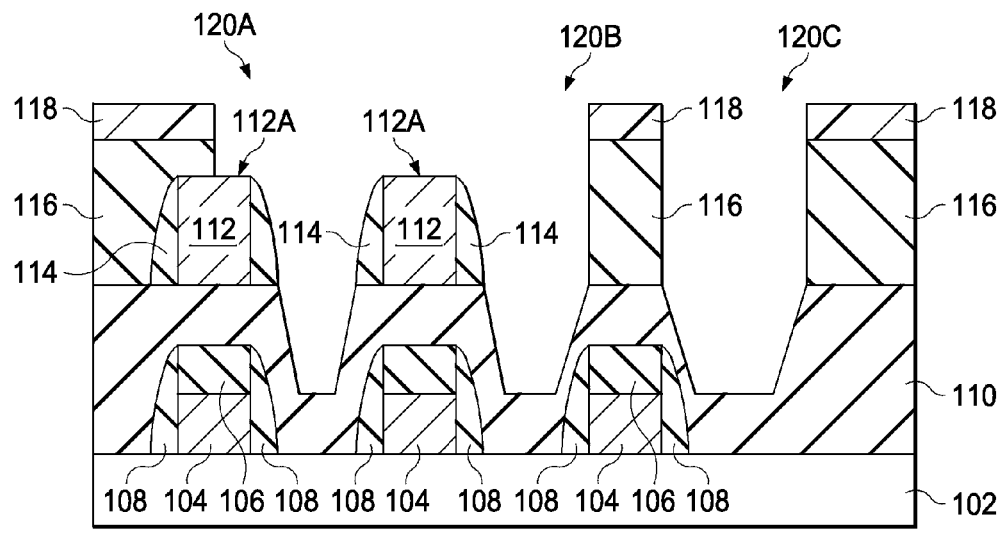

FIGS. 2A and 2B are similar to FIGS. 1A and 1B, respectively, and the descriptions will not be repeated herein. FIG. 2C is similar to FIG. 1C except that in FIG. 2C, the openings 120A and 120B do not have portion of patterning layer 118 between them. FIG. 2D illustrates the formation of the openings 120A, 120B, and 120C through the ILD 116 and partially through the ILD 110. In this embodiment, there is no portion of ILD 116 between openings 120A and 120B as the ILD 116 was removed because there was no portion of patterning layer 118 between the openings 120A and 120B. Also, in this embodiment, there is a portion of ILD 116 between openings 120B and 120C.

Figure 2E:
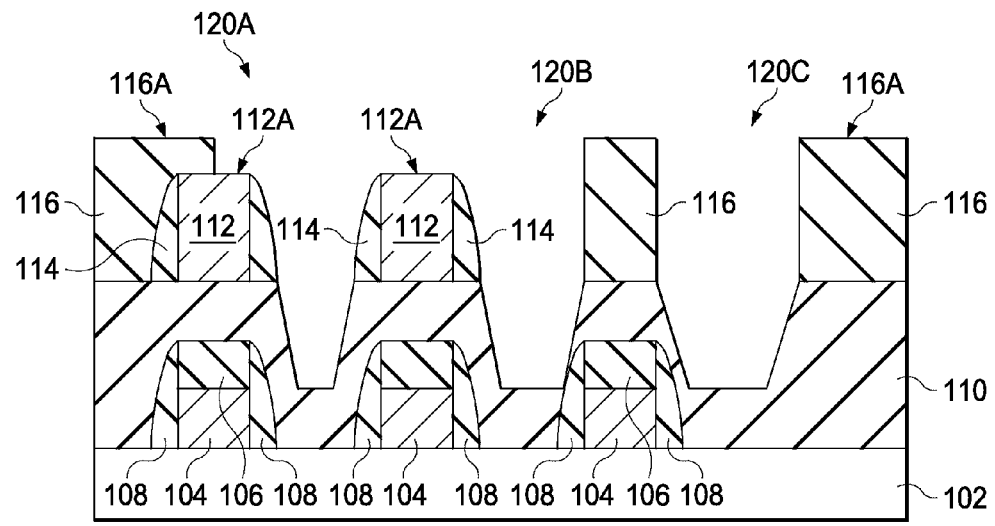

FIG. 2E illustrates the removal of the patterning layer 118 to expose the top surface 116A of the ILD 116. The patterning layer 118 may be removed by a CMP process, an etch process, the like, or a combination thereof.

Figure 2F:
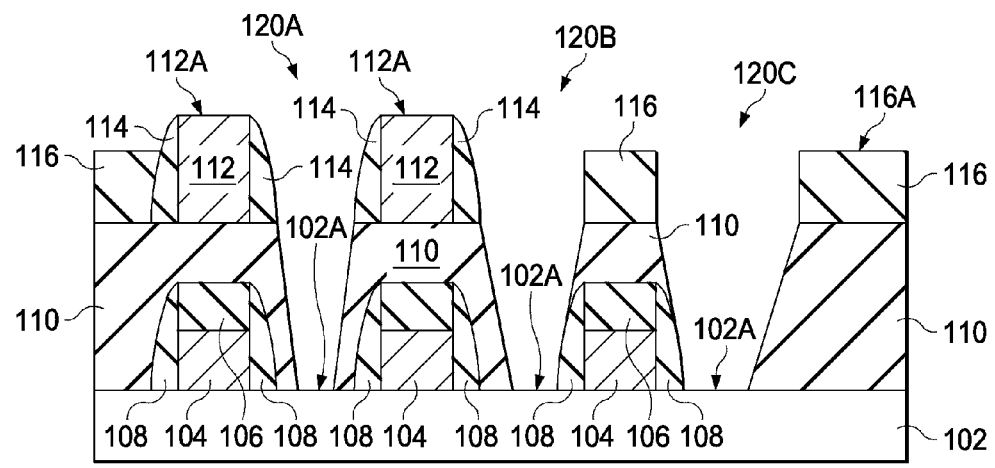

FIG. 2F illustrates forming the openings 120A, 120B, and 120C through the remaining portion of the ILD 110 to expose portions of the top surface 102A of the substrate 102. The semiconductor device in FIG. 2F is similar to the semiconductor device in FIG. 1F and the description will not be repeated herein. In this embodiment, even though the patterning layer 118 did not include a portion between the openings 120A and 120B (see FIG. 2C), the openings 120A and 120B ended up the same as the embodiment illustrated in FIG. 1F because the alignment structure 112 and alignment spacer 114 separate the openings 120A and 120B in both embodiments.

Figure 2G:
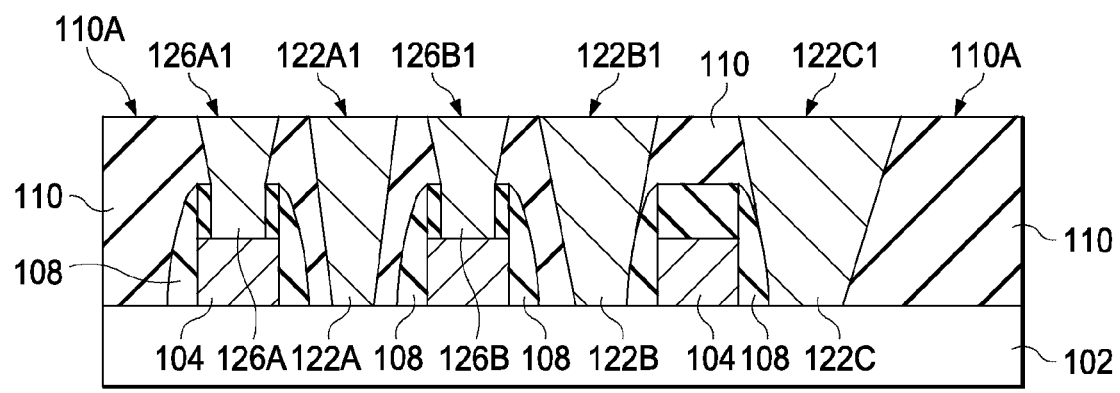

FIG. 2G illustrates the semiconductor device with conductive features 126A, 126B, 122A, 122B, and 122C similar to those described above in FIG. 1N. The processing steps between FIGS. 2F and 2G are similar to those illustrate in FIGS. 1G through 1N and are not repeated herein.

FIGS. 3A through 3L illustrate cross-sectional views of intermediate stages in the manufacturing of a semiconductor device in accordance with an embodiment. Details regarding this embodiment that are similar to those for the previously described embodiment will not be repeated herein.

Figure 3A:
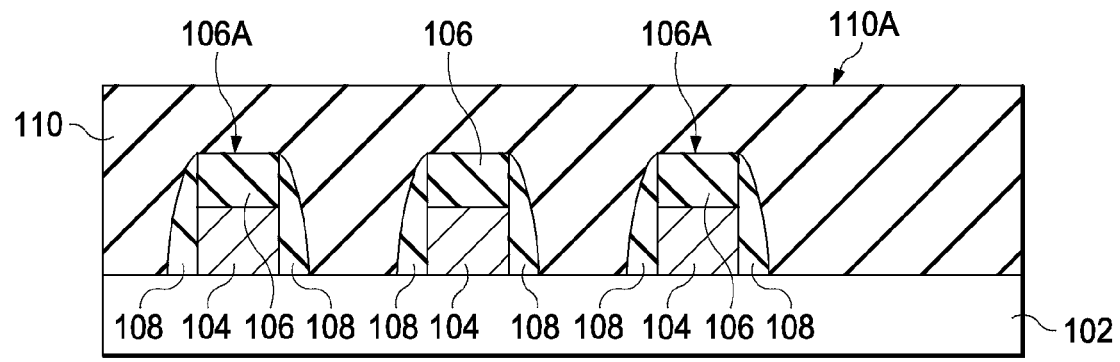
FIGS. 3A through 3L illustrate cross-sectional views of intermediate stages in the manufacturing of a semiconductor device in accordance with an embodiment.
Figure 3B:
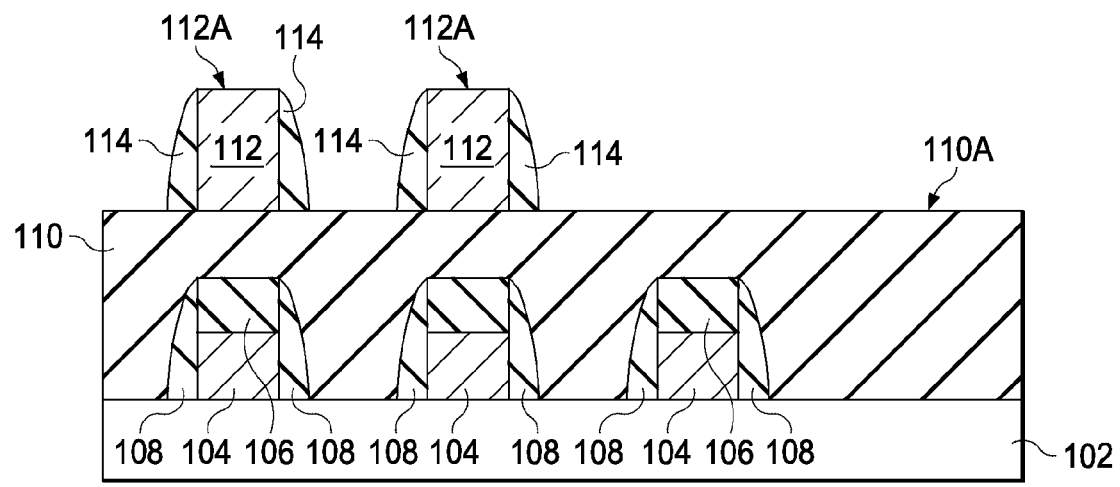
Figure 3C:
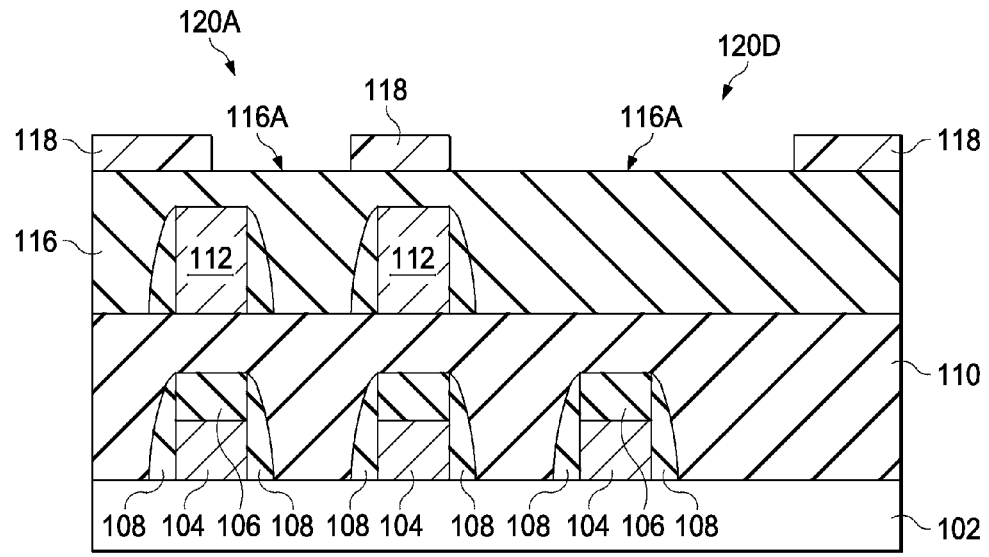

FIGS. 3A and 3B are similar to FIGS. 1A and 1B, respectively, and the descriptions will not be repeated herein. FIG. 3C is similar to FIG. 1C except that in FIG. 3C, the openings 120B and 120C of FIG. 1C do not have a portion of patterning layer 118 between them forming a single opening 120D in FIG. 2C.

Figure 3D:
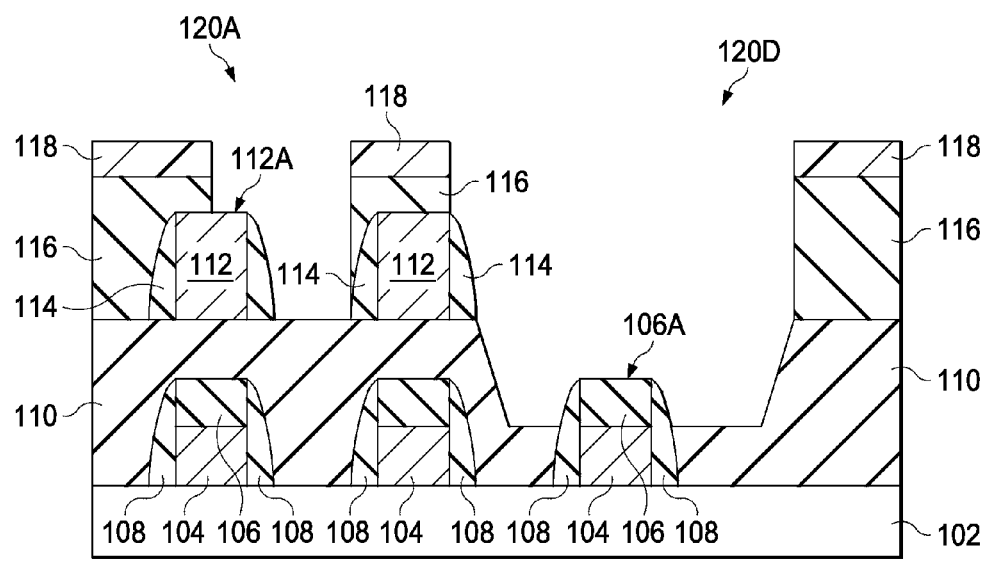

FIG. 3D illustrates the formation of the openings 120A and 120D through the ILD 116 and partially through the ILD 110. In this embodiment, the opening 120D includes the entire top surface 106A of a hard mask 106 on a gate 104 as there was no portion of ILD 116 on the hard mask 106.

Figure 3E:
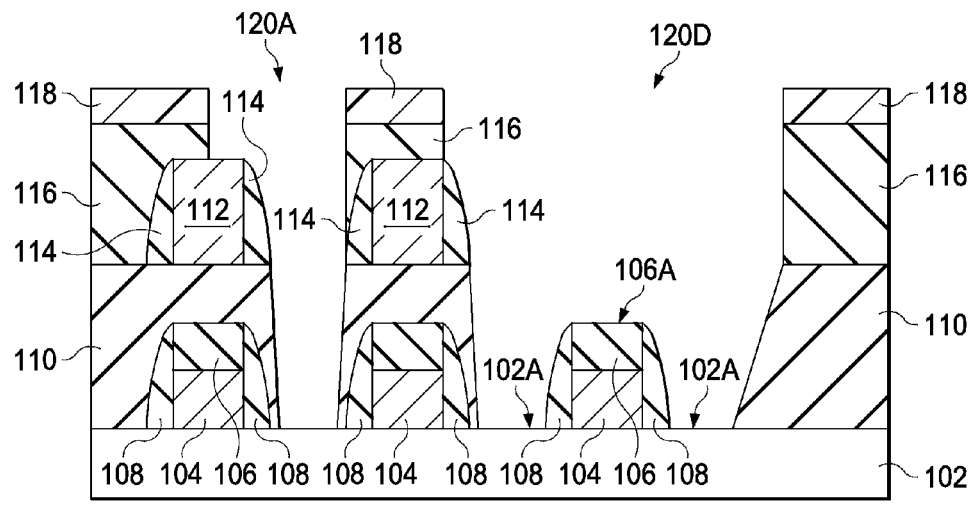

FIG. 3E illustrates the removal of the patterning layer 118 and forming the openings 120A and 120D through the remaining portion of the ILD 110 to expose portions of the top surface 102A of the substrate 102. In this embodiment, the opening 120D includes a gate 104, hard mask 106, and gate spacers 108 along a bottom of the opening 120D.

Figure 3F:
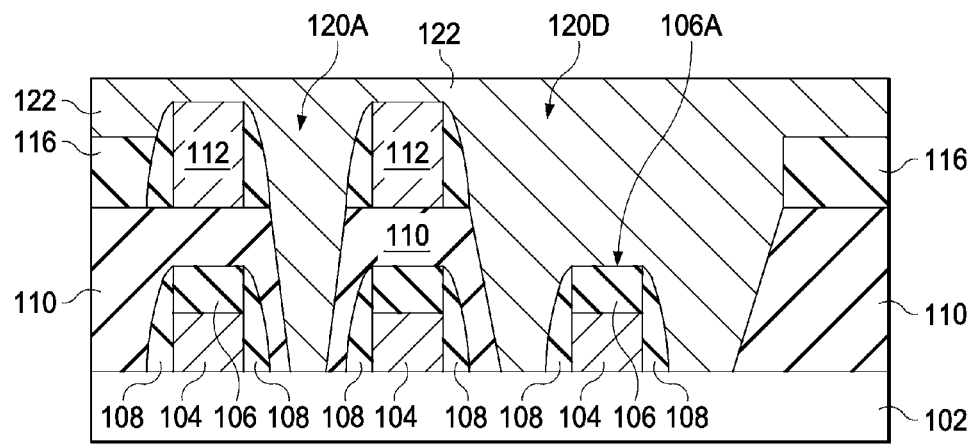

FIG. 3F illustrates the formation of a conductive layer 122 in the openings 120A and 120D contacting the top surface 102A of the substrate 102 and along the top surface 106A of a hard mask 106, gate spacers 108, top surfaces 116A of the ILD 116, top surfaces 112A of the alignment structures 112, and alignment spacers 114.

Figure 3G:
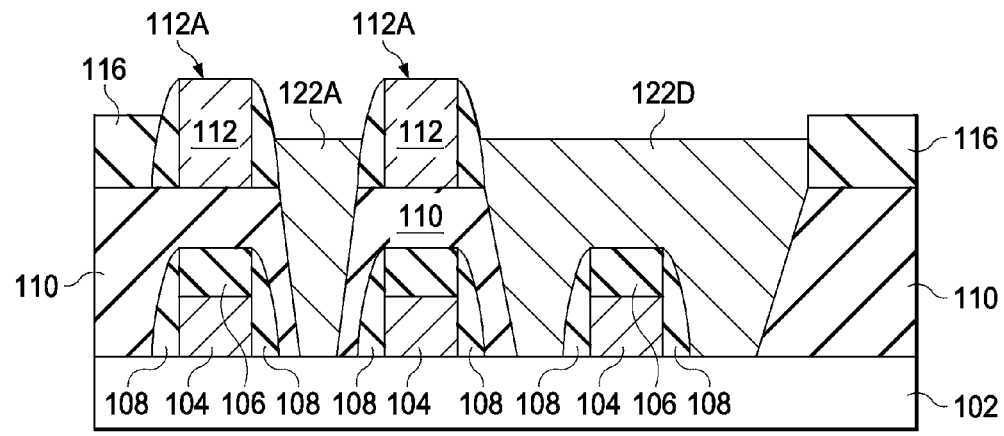

FIG. 3G illustrates the recessing of the conductive layer 122 to form conductive features 122A and 122D in the openings 120A and 120D, respectively. In this embodiment, the conductive feature 122D coupled to the substrate 102 on at least two sides of a gate 104. In some embodiments, a single gate 104 is embedded in the conductive feature 122D. In other embodiments, more than one gate 104 is embedded in the conductive feature 122D.

Figure 3H:
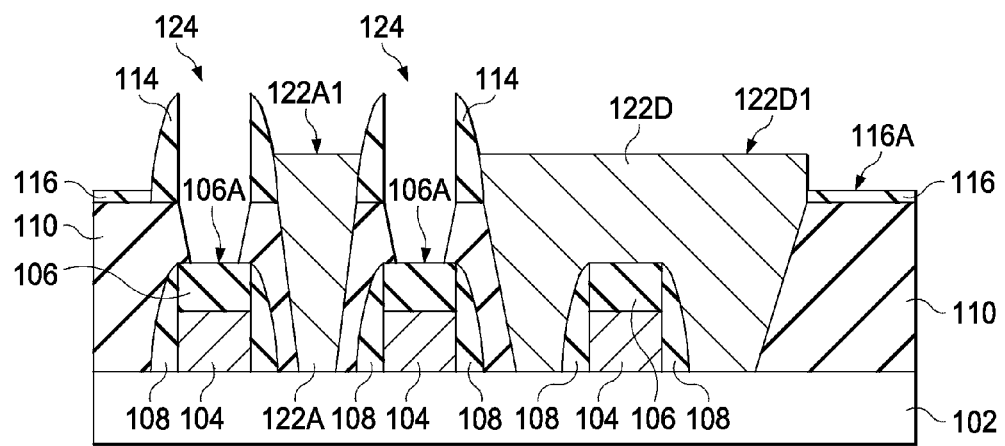
Figure 3I:
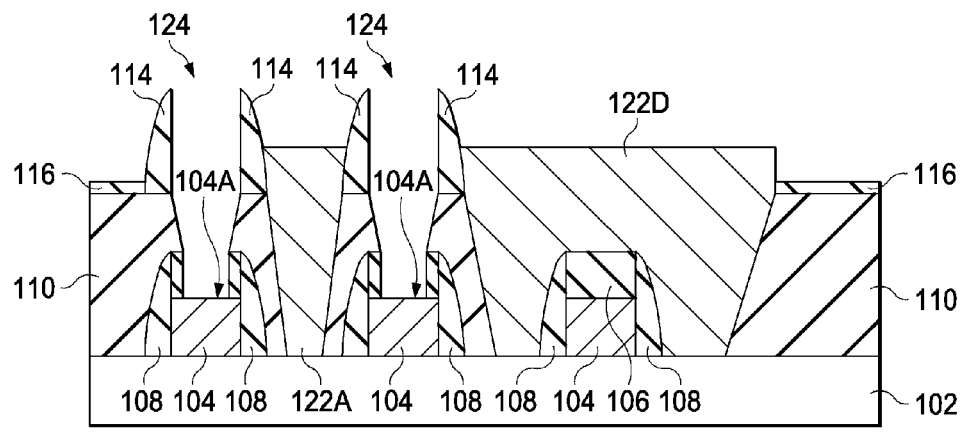

FIG. 3H illustrates the formation of openings 124 by removing the alignment structures 112 from between the alignment spacers 114 and extending the openings 124 through the ILD 110 to expose the top surfaces 106A of the hard masks 106. In some embodiments, after the openings 124 are extended to the hard masks 106, the top surfaces 122A1 and 122D1 are higher than the top surface 116A of the ILD 116. FIG. 3I illustrates extending the openings 124 through the hard masks 106 to expose top surfaces 104A of the gates 104.

Figure 3J:
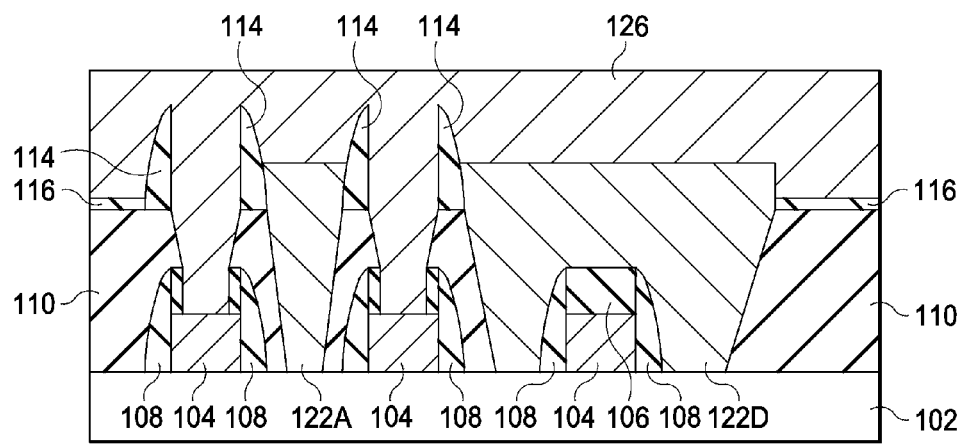

FIG. 3J illustrates the formation of the conductive layer 126 in the openings 124 contacting the top surface 104A of the gates 104 and over the alignment spacers 114 and the conductive features 122A and 122D. The conductive layer 126 may be formed of similar materials and by similar processes as the conductive layer 122 discussed above and the description will not be repeated herein, although the conductive layers 122 and 126 need not be the same.

Figure 3K:
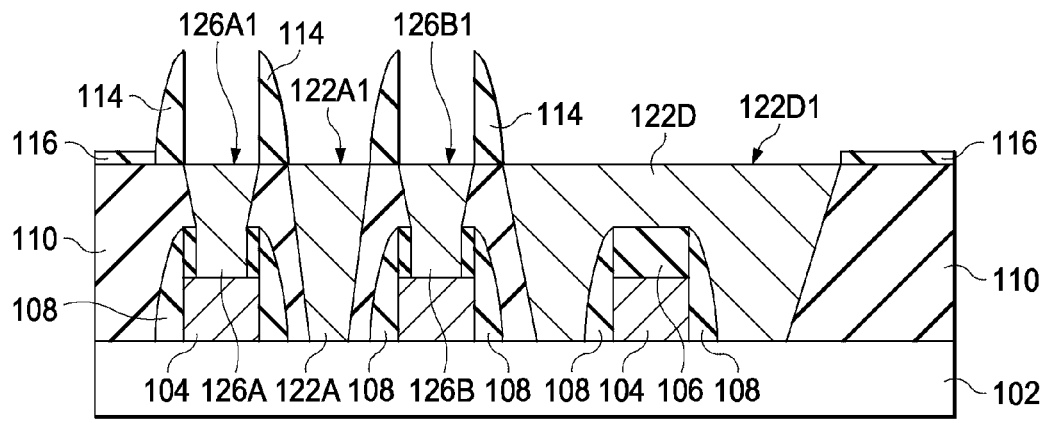

FIG. 3K illustrates the recessing of the conductive layer 126 to form conductive features 126A and 126B in the openings 124 and the recessing of the conductive features 122A, 122B, and 122C. In some embodiments, the top surfaces 126A1 and 126B1 of the conductive features 126A and 126B, respectively, and the top surfaces 122A1 and 122D1 of the conductive features 122A and 122D, respectively, are substantially coplanar after the recessing.

Figure 3L:
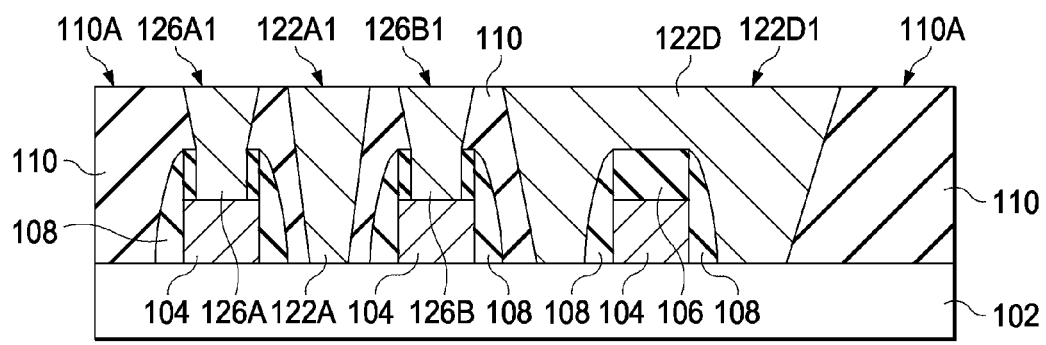

FIG. 3L illustrates the removal of the alignment spacers 114 and the remaining portions of ILD 116 and the planarization of the ILD 110, conductive features 126A, 126B, 122A, and 122D. The planarization process may be a CMP process, an etch process, the like, or a combination thereof. In some embodiments, the top surfaces 126A1 and 126B1 of the conductive features 126A and 126B, respectively, the top surfaces 122A1 and 122D1 of the conductive features 122A and 122D, respectively, and the top surface 110A of the ILD 110 are substantially coplanar after the planarization process. The conductive features 126A and 126B may be used as contacts to couple the gates 104 to layers above the ILD 110 and the conductive features 122A and 122D may be used as contacts to couple the substrate 102 and devices and metallization layers formed therein to layers above ILD 110. In some embodiments, the conductive feature 122D is used to couple devices that have higher current requirements than the devices coupled to the conductive feature 122A.

Figure 4A:
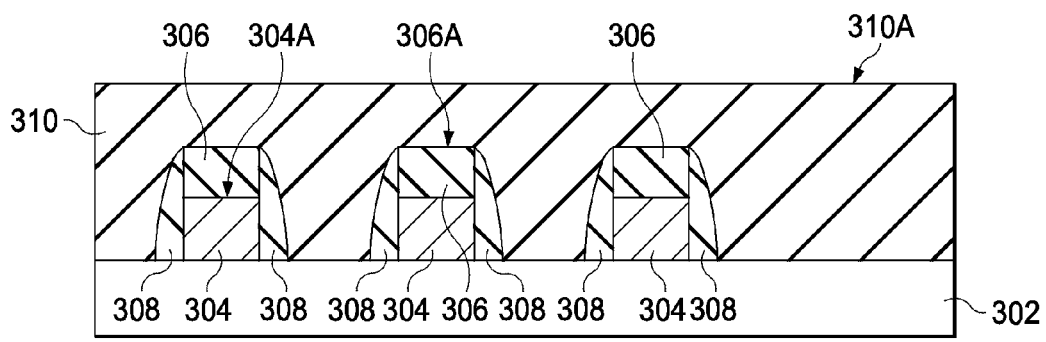
FIGS. 4A through 4N illustrate cross-sectional views of intermediate stages in the manufacturing of a semiconductor device in accordance with an embodiment.
Figure 4B:
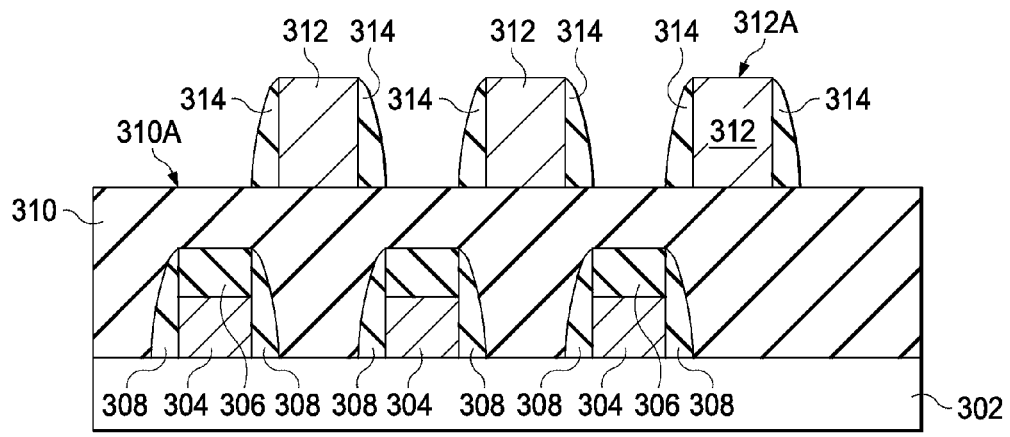
Figure 4C:
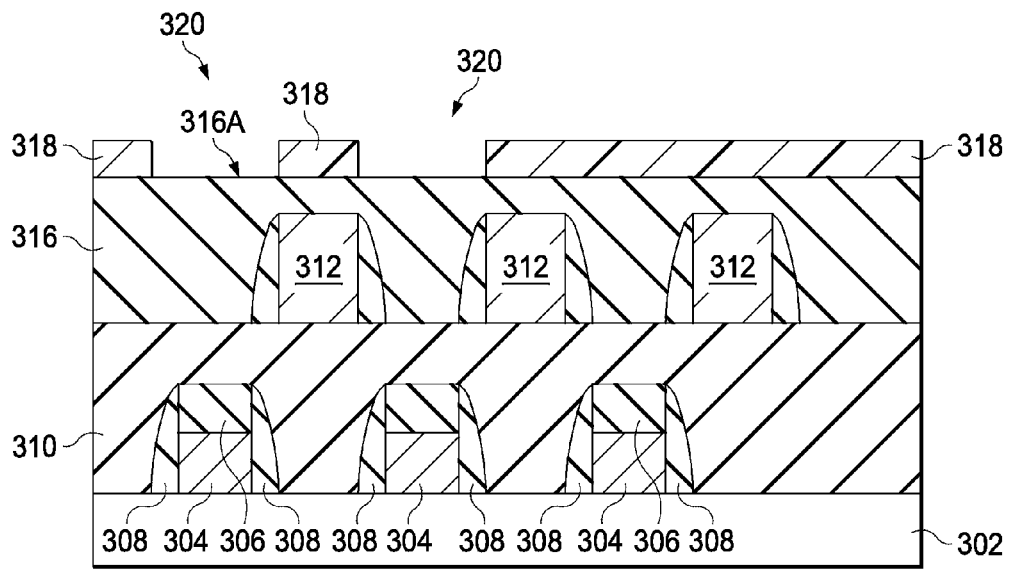
Figure 4D:
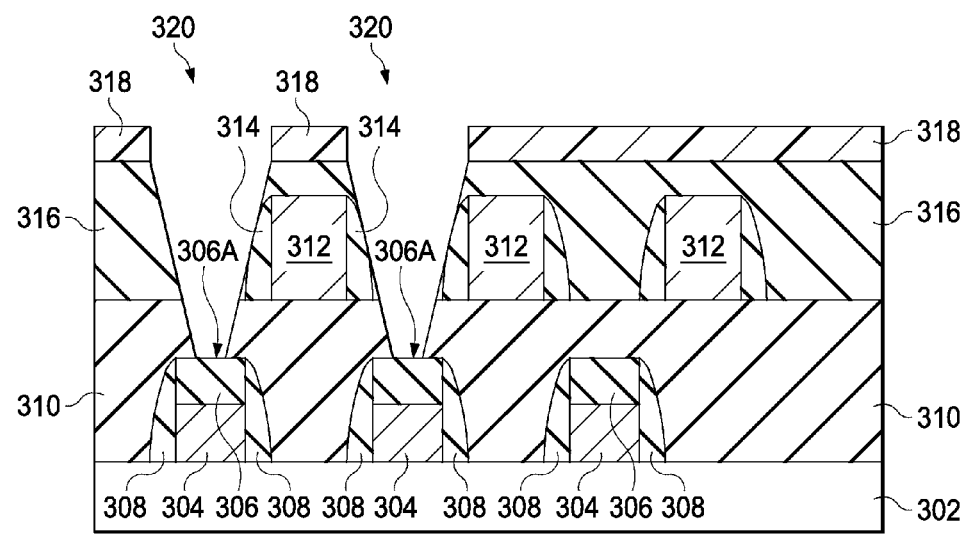
Figure 4E:
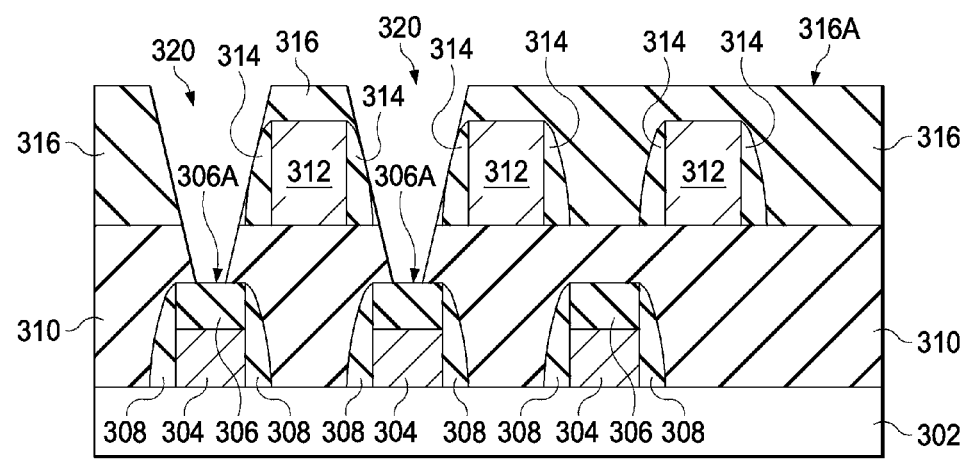
Figure 4F:
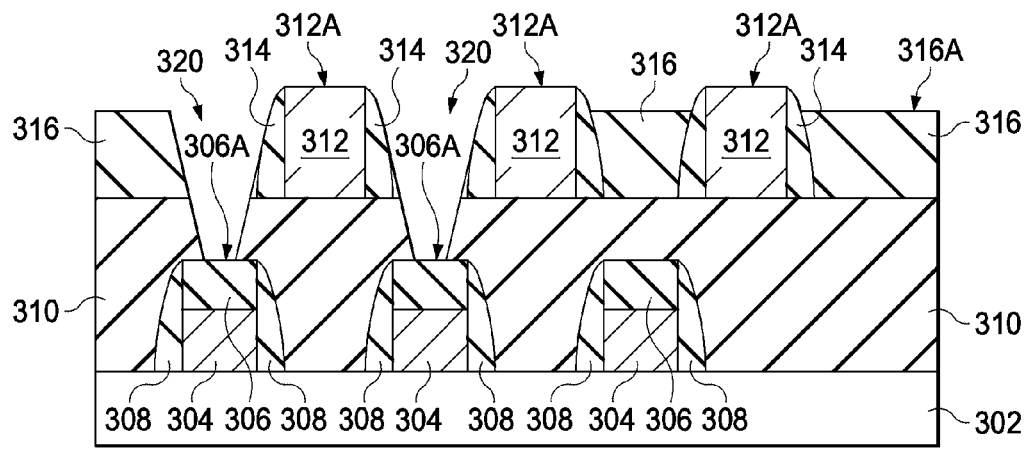
Figure 4G:
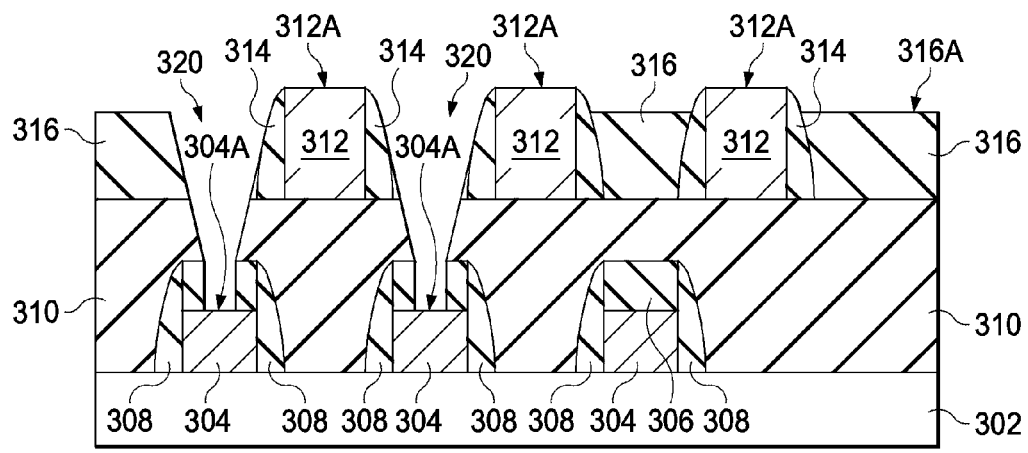
Figure 4H:
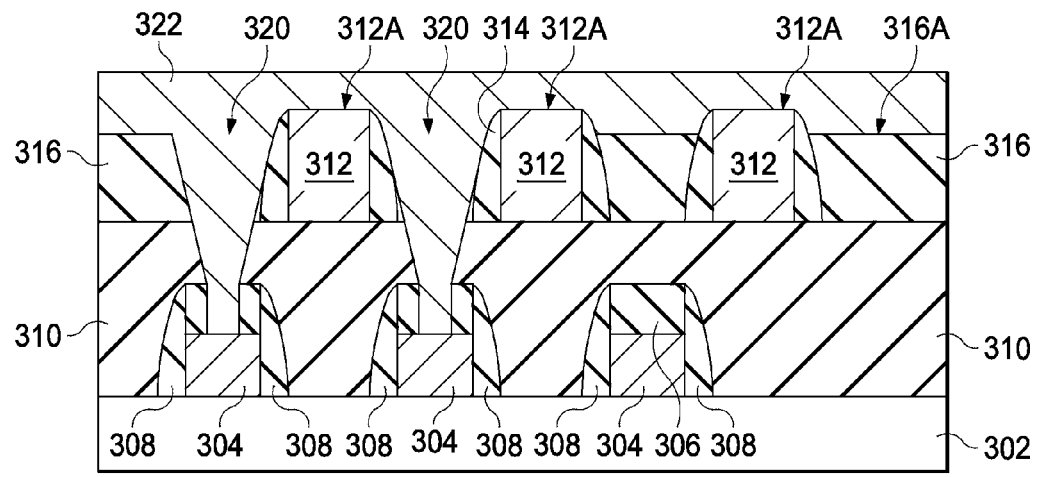
Figure 4I:
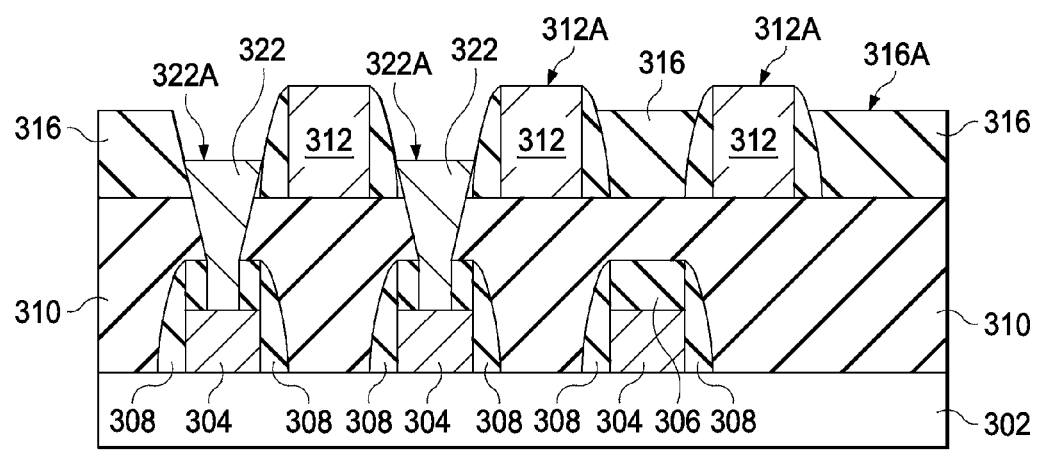
Figure 4J:
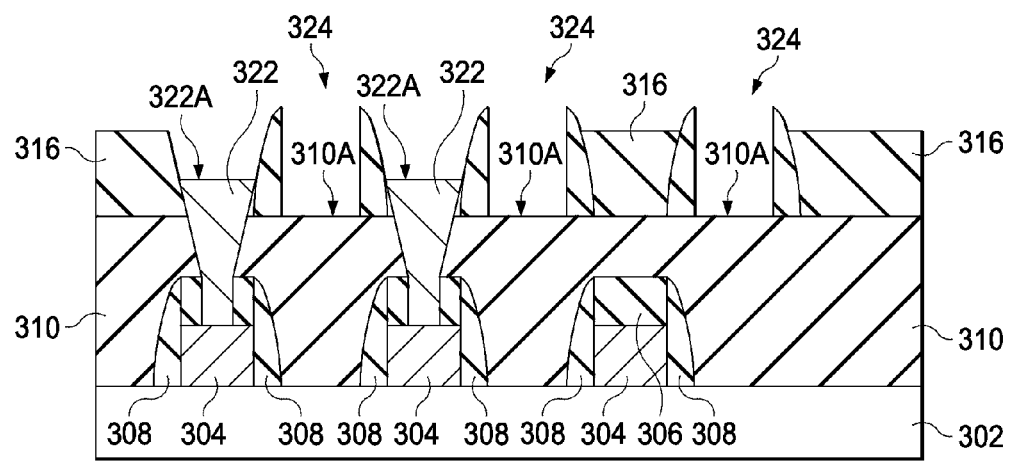
Figure 4K:
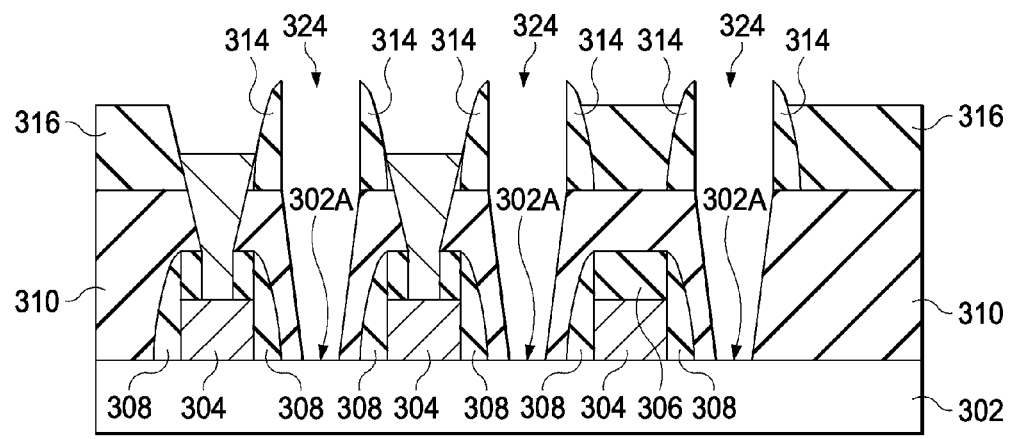
Figure 4L:
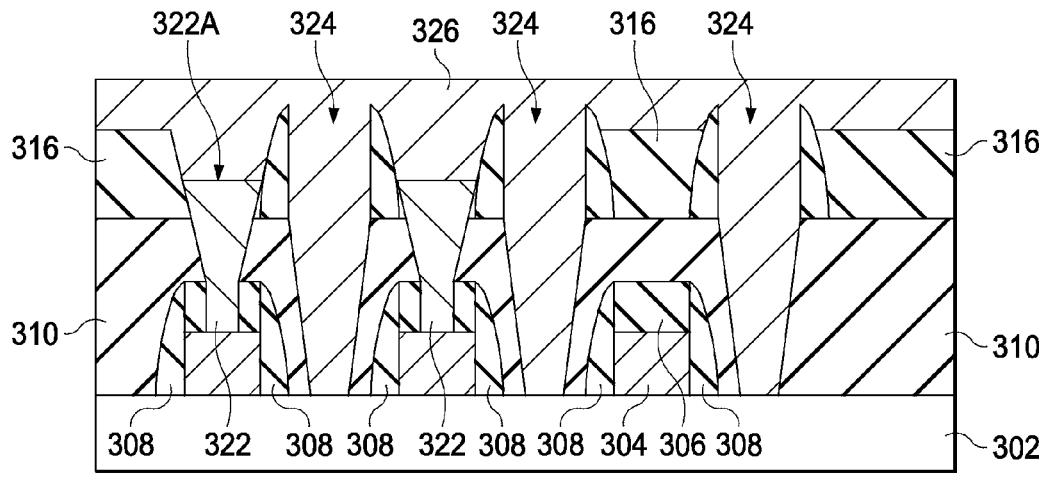
Figure 4M:
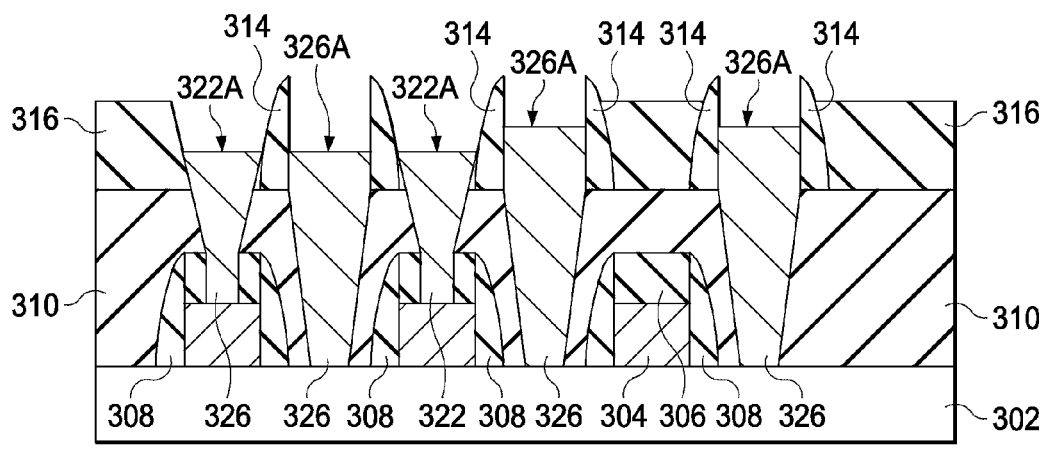
Figure 4N:
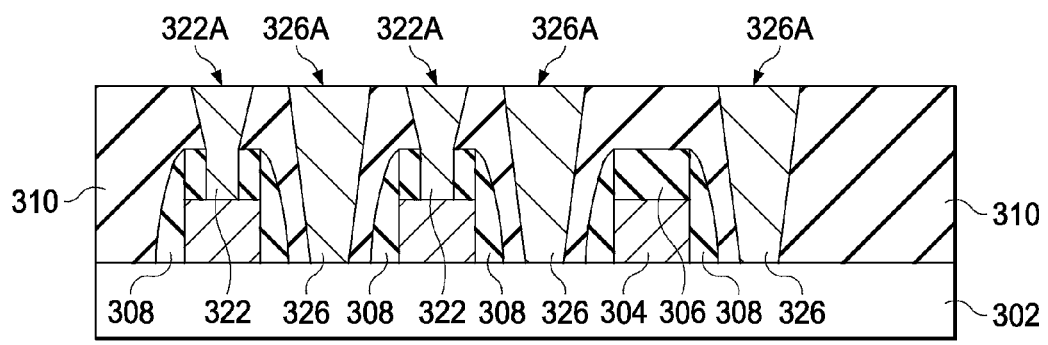

FIGS. 4A through 4N illustrate cross-sectional views of intermediate stages in the manufacturing of a semiconductor device in accordance with an embodiment. Details regarding this embodiment that are similar to those for the previously described embodiment will not be repeated herein.

FIG. 4A illustrates a semiconductor device includes a substrate 302, gates 304, hard masks 306 on the gates 304, gate spacers 308 on the sidewalls of the gates 304, and an ILD 310 over the gates 304, the hard masks 306, and the gate spacers 308. The substrate 302, gates 304, hard masks 306, gate spacers 308, and ILD 310 may be formed of similar materials and similar processes as the substrate 102, gates 104, hard masks 106, gate spacers 108, and ILD 110 described above and the descriptions will not be repeated herein. However, the materials and processes of the two embodiments of the semiconductor device need not be the same.

FIG. 4B illustrates the formation of alignment structures 312 and alignment spacers 314 on the top surface 310A of the ILD 310. The alignment structures 312 and the alignment spacers 314 may be formed of similar materials and by similar processes as the alignment structures 112 and the alignment spacers 114, respectively, described above and the descriptions will not be repeated herein, although the materials and processes need not be the same. In embodiment, each of the alignment structures 312 is aligned between a pair of adjacent gates 304 in the layer below the respective alignment structure 312.

FIG. 4C illustrates the formation of an ILD 316 and a patterning layer 318 over the ILD 310. The ILD 316 is formed over the alignment structures 312 and the alignment spacers 314 and on the ILD 310. The ILD 316 may be formed of similar materials and by similar processes as the ILD 116 described above and the description will not be repeated herein, although the ILD 316 and the ILD 116 need not be the same.

The patterning layer 318 is formed and patterned over the ILD 316. The patterning layer 318 may be formed of similar materials and patterned by similar processes as the patterning layer 118 described above and the description will not be repeated herein. The patterning layer 318 is patterned to form openings 320 exposing portions of the top surface 316A of the ILD 316. In some embodiments, each of the openings 320 is aligned directly over a gate 304.

FIG. 4D illustrates extending the openings 320 through the ILD 316 and partially through the ILD 310 to expose portions of top surfaces 306A of the hard masks 306. The openings 320 may be formed by using acceptable etching techniques such as, for example, an anisotropic dry etch.

FIG. 4E illustrates the removal of the patterning layer 318 to expose the top surface 316A of the ILD 316. The patterning layer 318 may be removed by a CMP process, an etch process, the like, or a combination thereof.

FIG. 4F illustrate the thinning of the ILD 316 to expose top surfaces 312A of the alignments structures 312. The thinning process may be by a CMP process, an etch process, the like, or a combination thereof.

FIG. 4G illustrates extending the openings 320 through the hard masks 306 to expose top surfaces 304A of the gates 304. The openings 320 may be extended through the hard masks 306 by using acceptable etching techniques such as, for example, an anisotropic dry etch.

FIG. 4H illustrates the formation of a conductive layer 322 in the openings 320 contacting the top surface 304A of the gates 304 and along the top surfaces 312A of the alignment structures 312, the alignment spacers 314, and the ILD 36. The conductive layer 322 may be formed of similar materials and by similar processes as the conductive layer 122 discussed above and the description will not be repeated herein, although the conductive layers 322 and 122 need not be the same.

FIG. 4I illustrates the recessing of the conductive layer 322 to form conductive features 322 in the openings 320. In some embodiments, the top surfaces 322A of the conductive features 322 are lower than the top surfaces 312A of the alignment structures 312 and the top surface 316A of the ILD 316. This recessing process may be similar to the recessing process of conductive layer 122 described above and the description will not be repeated herein, although the recessing processes need not be the same.

FIG. 4J illustrates the formation of openings 324 by removing the alignment structures 312 from between the alignment spacers 314 to expose the top surface 310A of the ILD 310. The alignment structures 312 may be removed by a wet etch process that is selective to the alignment structures 312.

FIG. 4K illustrates extending the openings 324 through the ILD 310 to expose portions of the top surface 302A of the substrate 302. The openings 324 may be extended through the ILD 310 by using acceptable photolithography and etching techniques such as, for example, an anisotropic dry etch.

FIG. 4L illustrates the formation of a conductive layer 326 in the openings 324 contacting the top surface 302A of the substrate 302 and over the conductive features 322. The conductive layer 326 may be formed of similar materials and by similar processes as the conductive layer 122 discussed above and the description will not be repeated herein.

FIG. 4M illustrates the recessing of the conductive layer 326 to form conductive features 326 in the openings 324. In some embodiments, the top surfaces 326A of the conductive features 326 and the top surfaces 322A the conductive features 322 are substantially coplanar after the recessing. This recessing process may be similar to the recessing process of conductive layer 122 described above and the description will not be repeated herein, although the recessing processes need not be the same.

FIG. 4N illustrates the removal of the alignment spacers 314 and the remaining portions of ILD 116 and the planarization of the ILD 310 and the conductive features 322 and 326. The planarization process may be a CMP process, an etch process, the like, or a combination thereof. In some embodiments, the top surfaces 326A of the conductive features 326, the top surfaces 322A of the conductive features 322, and the top surface 310A of the ILD 310 are substantially coplanar after the planarization process. The conductive features 322 may be used as contacts to couple the gates 304 to layers above the ILD 310 and the conductive features 326 may be used as contacts to couple the substrate 302 and devices and metallization layers formed therein to layers above ILD 310.

Figure 5A:
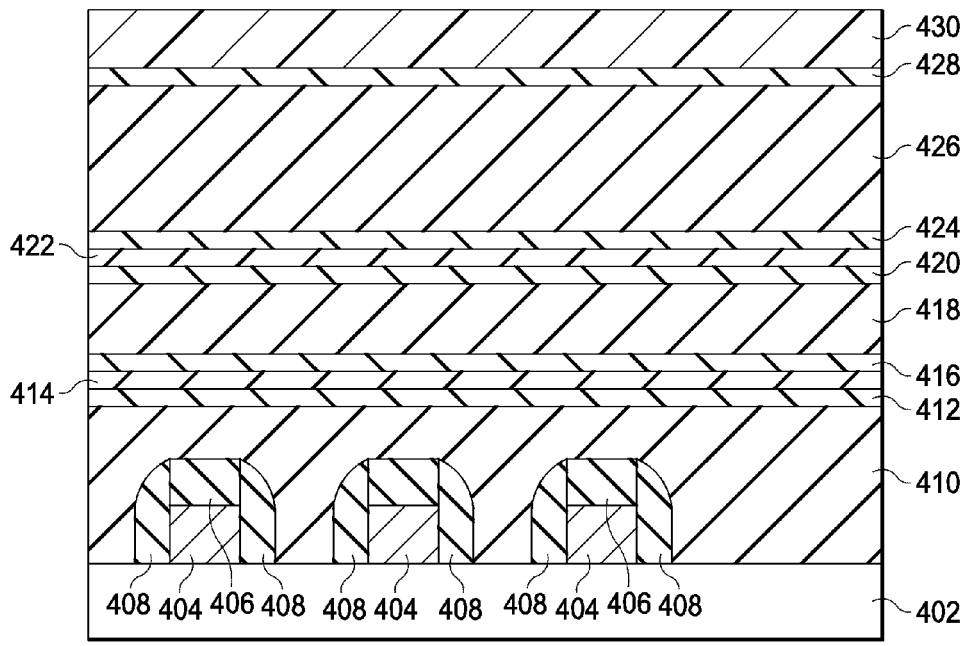
FIGS. 5A through 5T illustrate cross-sectional views of intermediate stages in the manufacturing of a semiconductor device in accordance with an embodiment.
Figure 5B:
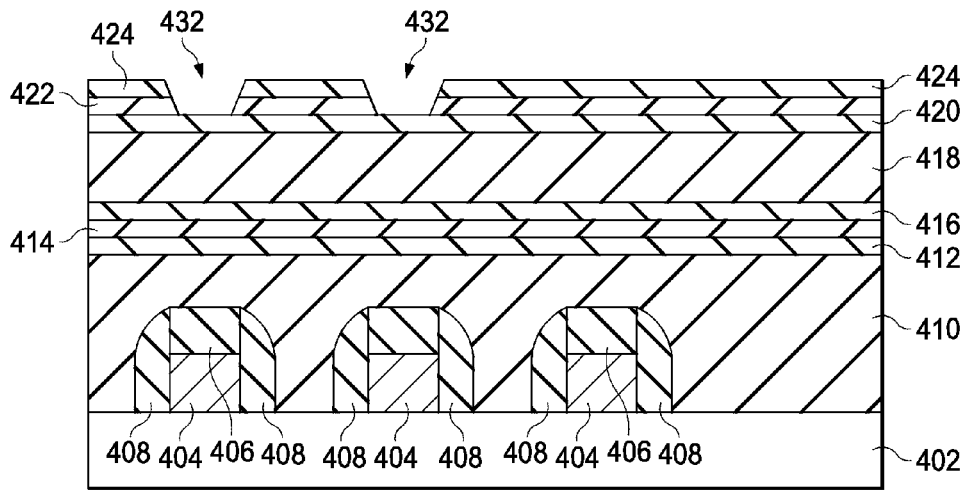
Figure 5C:
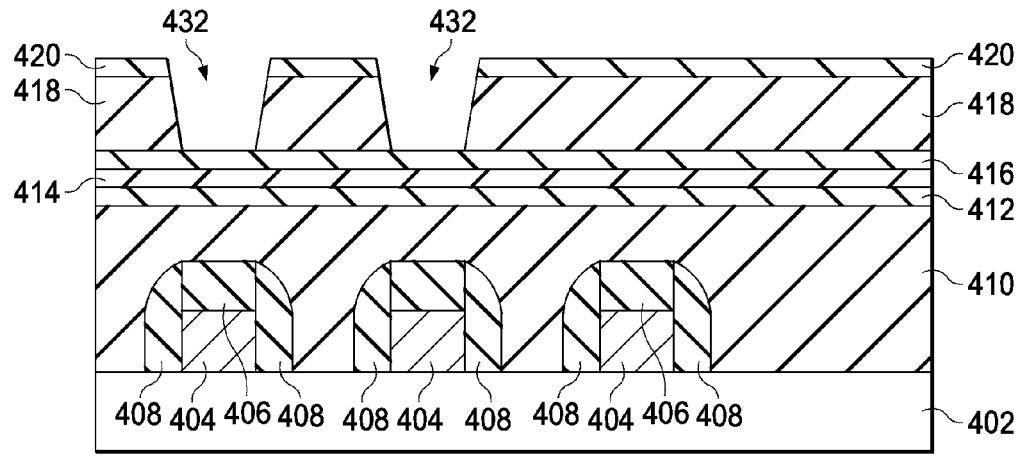
Figure 5D:
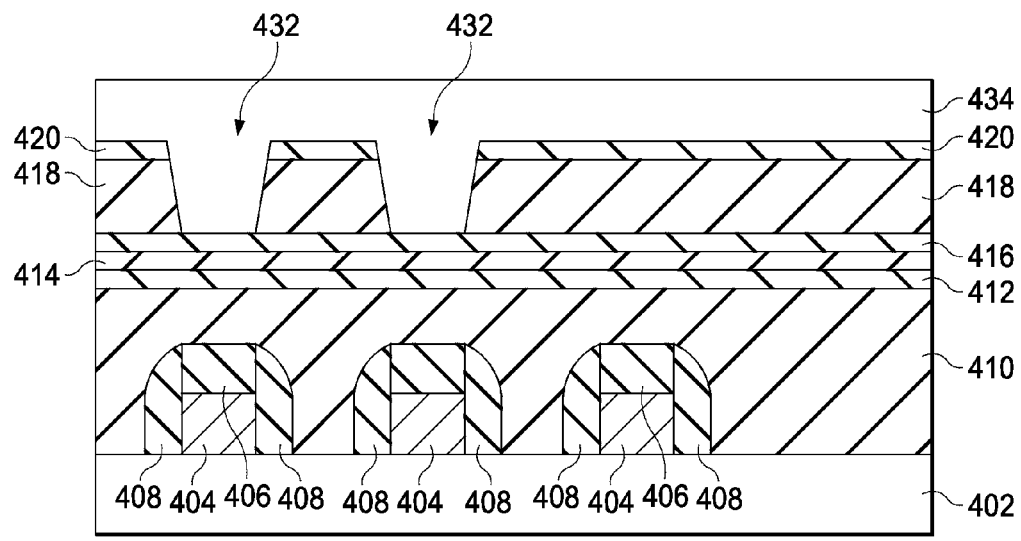
Figure 5E:
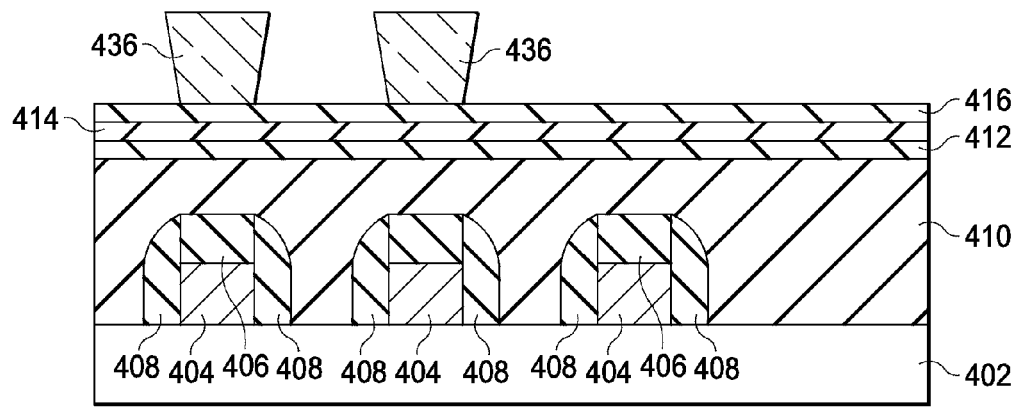
Figure 5F:
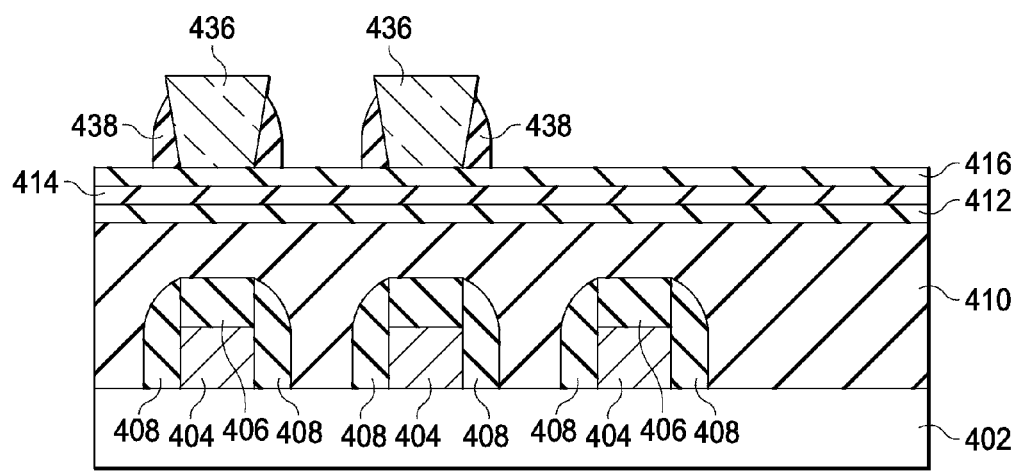
Figure 5G:
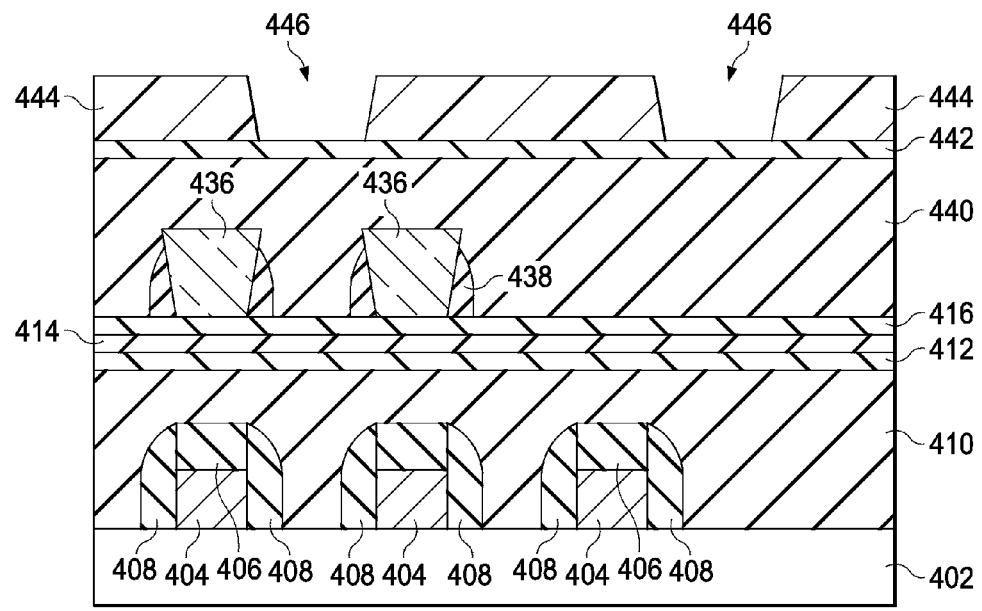
Figure 5H:
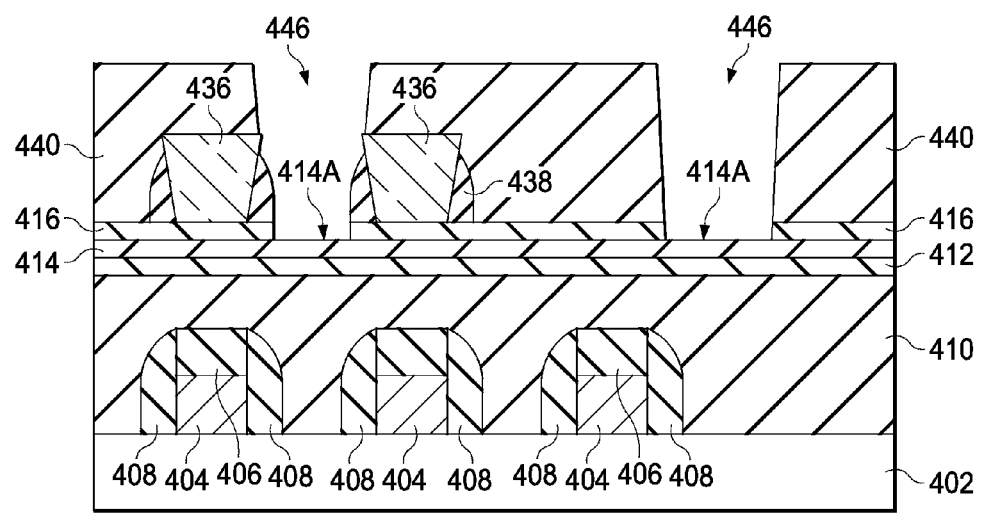
Figure 5I:
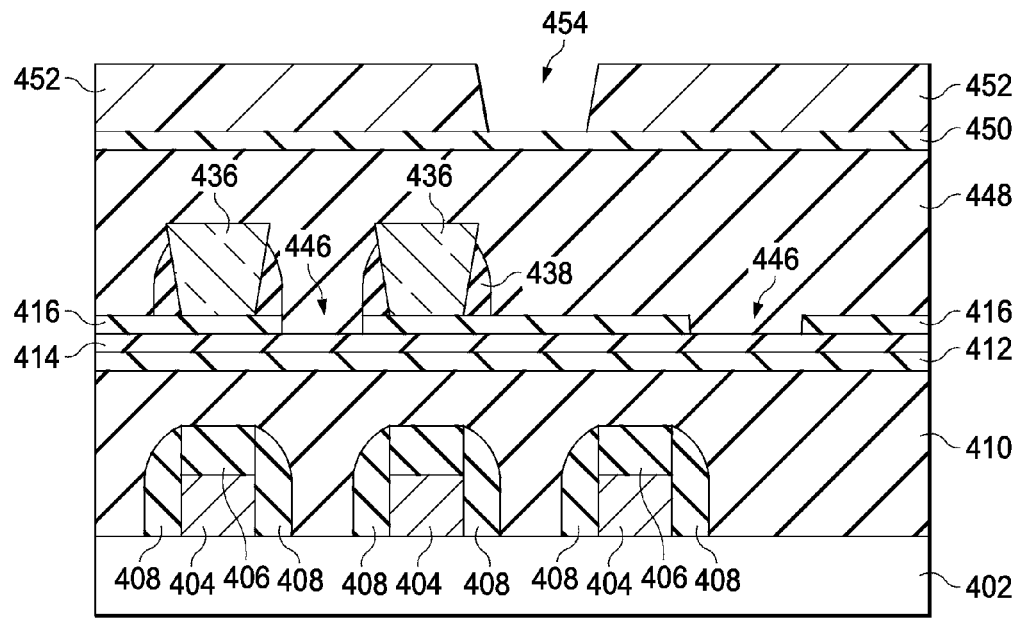
Figure 5J:
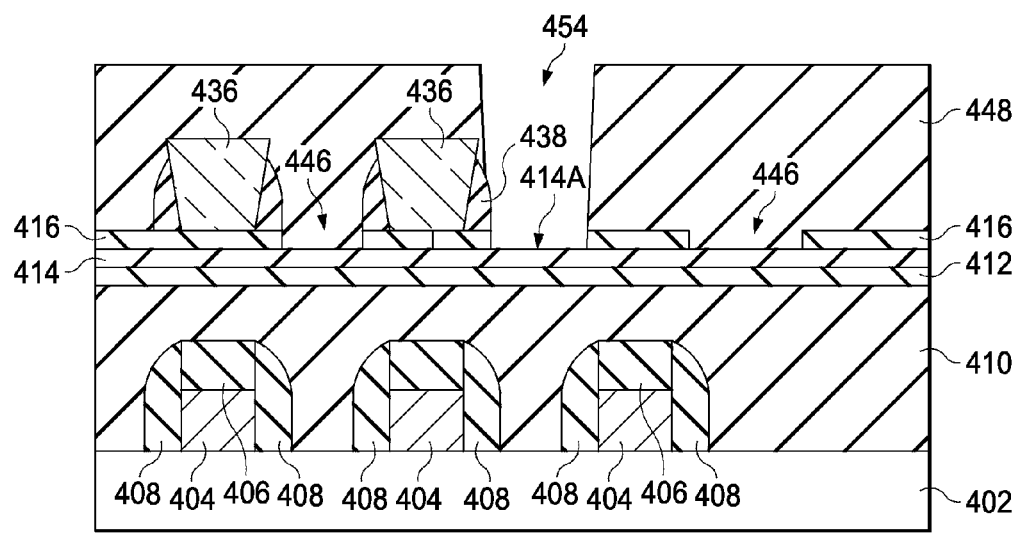
Figure 5K:
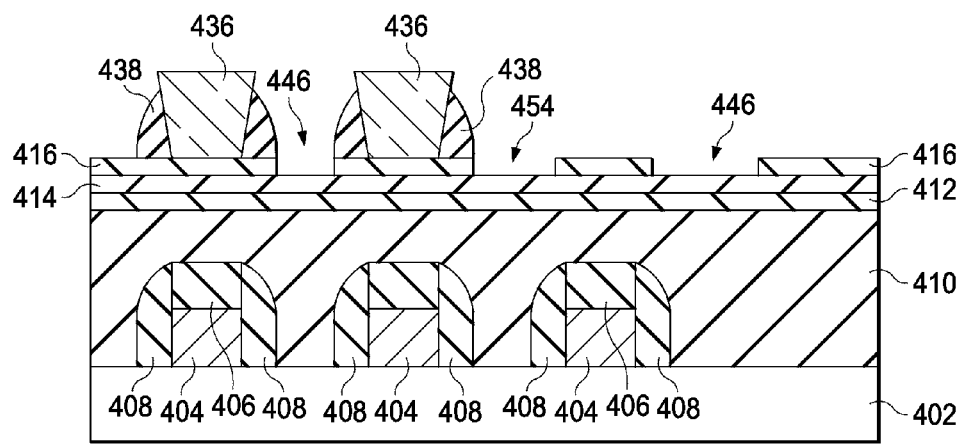
Figure 5L:
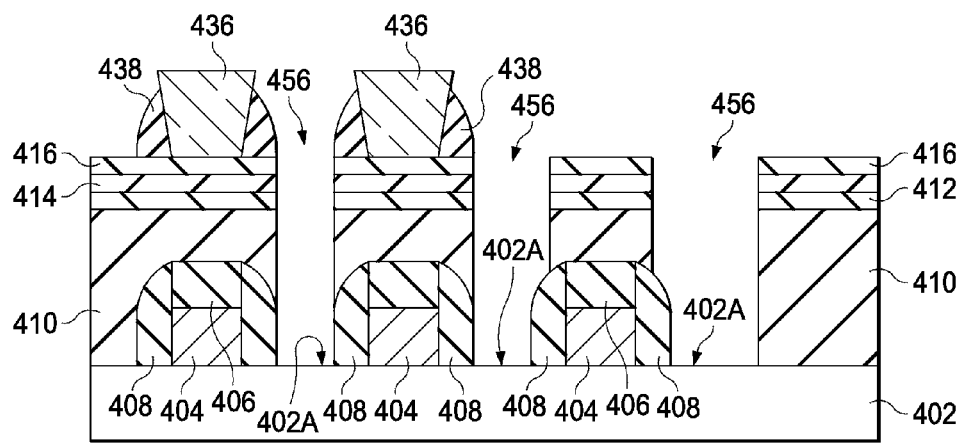
Figure 5M:
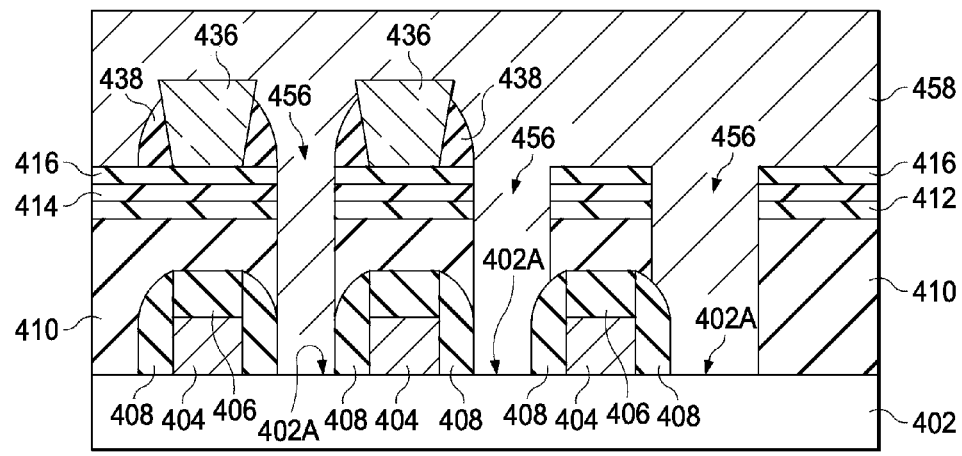
Figure 5N:
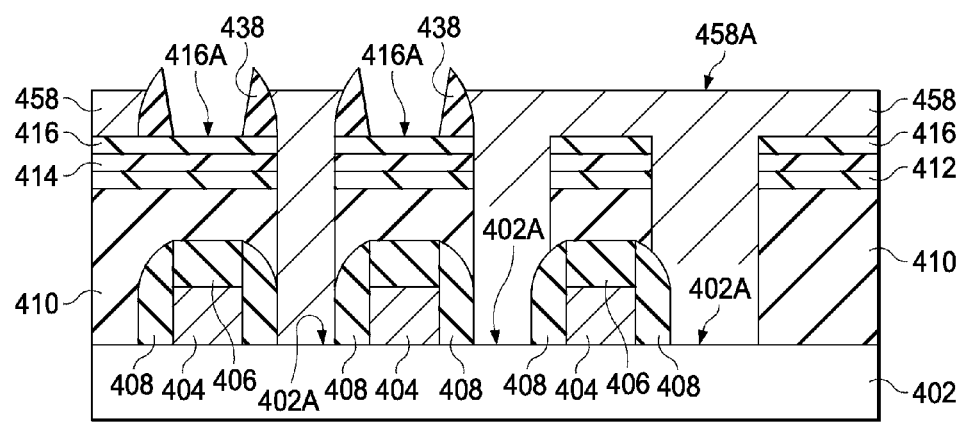
Figure 5O:
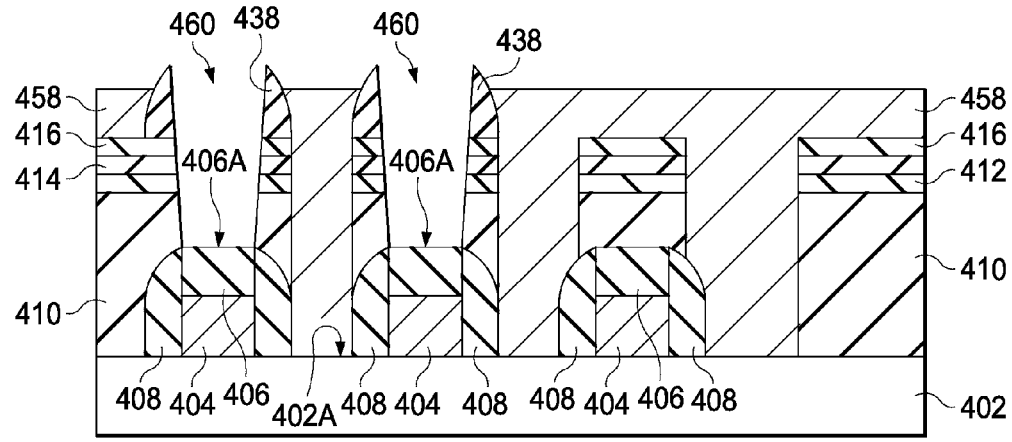
Figure 5P:
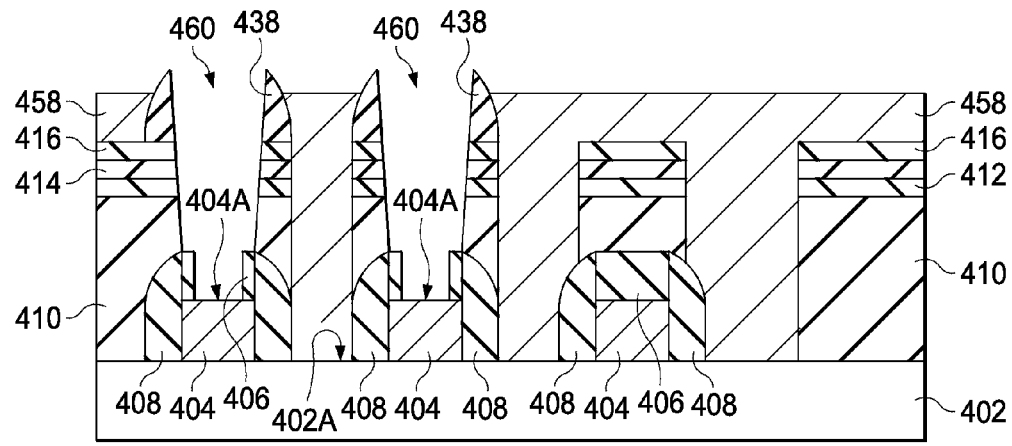
Figure 5Q:
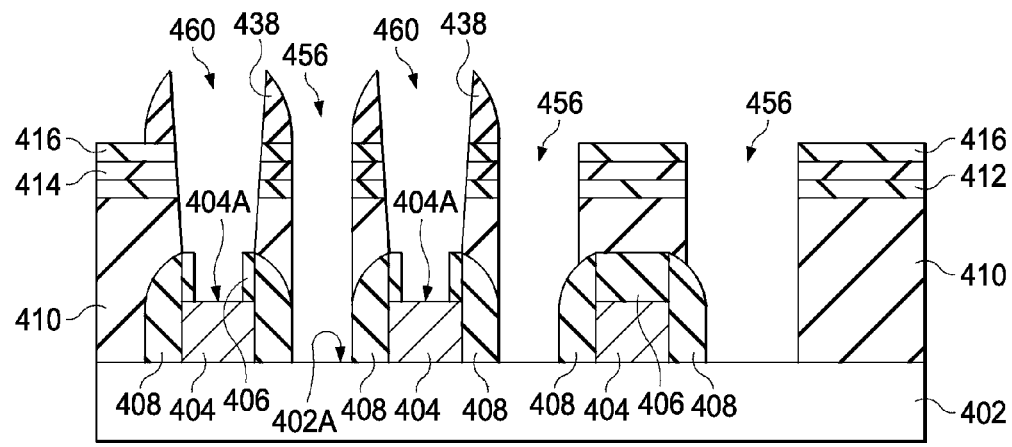
Figure 5R:
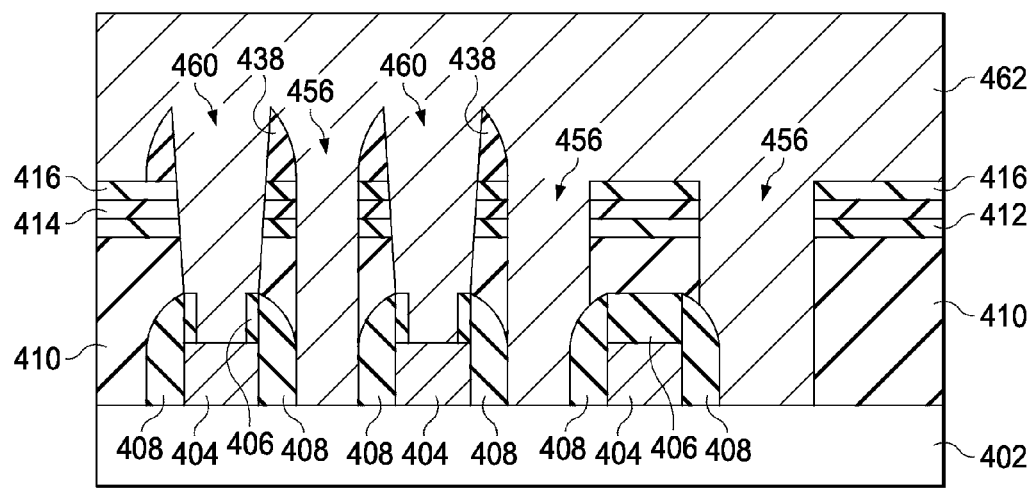
Figure 5S:
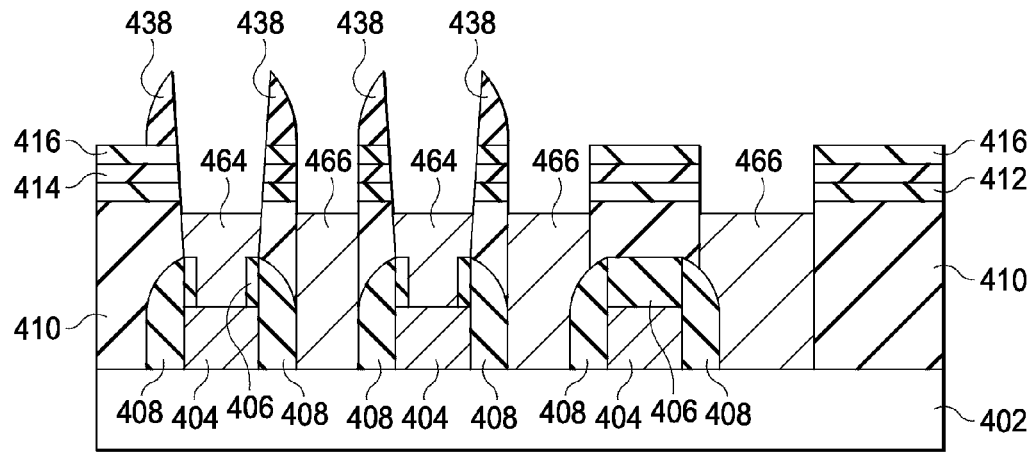
Figure 5T:
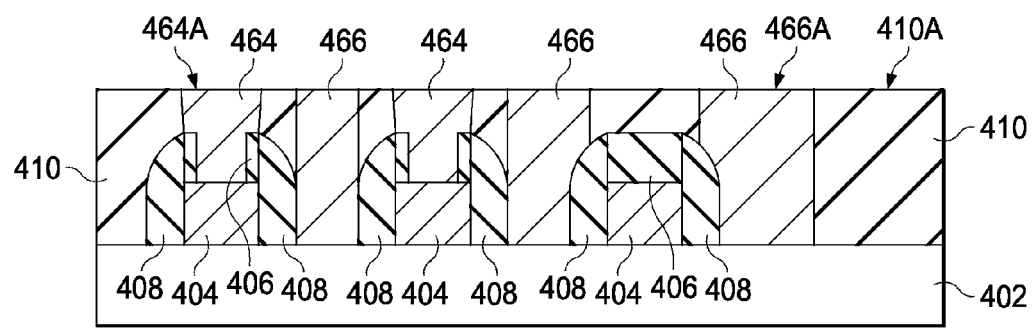

FIGS. 5A through 5T illustrate cross-sectional views of intermediate stages in the manufacturing of a semiconductor device in accordance with an embodiment. Details regarding this embodiment that are similar to those for the previously described embodiment will not be repeated herein.

FIG. 5A illustrates a semiconductor device includes a substrate 402, gates 404, hard masks 406 on the gates 404, gate spacers 408 on the sidewalls of the gates 404, and an ILD 410 over the gates 404, the hard masks 406, and the gate spacers 408. The semiconductor device further includes an anti-reflective coating (ARC) layer 412, a hardmask layer 414, an ARC layer 416, a dielectric layer 418, an ARC layer 420, a hardmask layer 422, an ARC layer 424, a dielectric layer 426, a hardmask layer 428, and a photoresist 430. The substrate 402, gates 404, hard masks 406, gate spacers 408, and ILD 410 may be formed of similar materials and similar processes as the substrate 102, gates 104, hard masks 106, gate spacers 108, and ILD 110 described above and the descriptions will not be repeated herein. However, the materials and processes of the two embodiments of the semiconductor device need not be the same.

The ARC layer 412 is formed over the ILD 410. The ARC layer 412 prevents radiation in a subsequent photolithographic process to reflect off layers below and interfering with the exposure process. Such interference can increase the critical dimension of the photolithography process. The ARC layer 412 may comprise SiON, a polymer, the like, or a combination thereof and may be formed by CVD, a spin-on process, the like, or a combination thereof. In an embodiment the ARC layer 412 is formed to a thickness of between about 200 Å and about 400 Å.

The hardmask layer 414 is formed over the ARC layer 412. The hardmask layer 414 may be a masking material such as poly-silicon, silicon nitride, the like, or a combination thereof and may be formed using a process such as plasma enhanced chemical vapor deposition (PECVD). However, any other suitable hardmask material, such as silicon oxide, and any other process of formation, such as CVD, may alternatively be utilized. In an embodiment the hardmask layer 414 is formed to a thickness of between about 200 Å and about 400 Å.

The ARC layer 416 is formed over the hardmask layer 414. The ARC layer 416 may be formed of similar materials and by similar processes as the ARC layer 412 described above and the description is not repeated herein, although the first and ARC layers 412 and 416 need not be the same. In an embodiment the ARC layer 416 is formed to a thickness of from about 200 Å to about 400 Å.

The dielectric layer 418 is formed over the ARC layer 416. The dielectric layer 418 may be formed of oxides such as silicon oxide, BPSG, USG, FSG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 418 may be deposited by CVD, PVD, ALD, an SOD process, the like, or a combination thereof. In an embodiment, the dielectric layer 418 is formed to a thickness of from about 300 Å to about 700 Å.

The ARC layer 420, the hardmask layer 422, the ARC layer 424, and the dielectric layer 426 are formed over the dielectric layer 418. The ARC layer 420, the hardmask layer 422, the ARC layer 424, and the dielectric layer 426 may be formed of similar materials and by similar processes as the ARC layer 412, the hardmask layer 414, the ARC layer 416, and the dielectric layer 418, respectively, described above and the descriptions are not repeated herein.

The hardmask layer 428 is formed over the dielectric layer 426. The hardmask layer may be formed of similar materials and by similar processes as the hardmask layer 414 described above and the description is not repeated herein. The photoresist 430 is formed over the hardmask layer 428. The photoresist 430 may be formed of a conventional photoresist material, such as a deep ultra-violet (DUV) photoresist. The photoresist 430 may be deposited on the surface of the hardmask layer 428, for example, by using a spin-on process to place the photoresist 430. However, any other suitable material or method of forming or placing a photoresist material may alternatively be utilized.

FIG. 5B illustrates the semiconductor device after undergoing a double patterning process to form openings 432. The double patterning process may be process including two photolithography exposure steps and two etching steps which may be referred to as a 2P2E process. The openings 432 extend through the ARC layer 424 and the hardmask layer 422 and expose portions of the ARC layer 420. The openings 432 may be formed by using acceptable photolithography and etching techniques such as, for example, an anisotropic dry etch.

FIG. 5C illustrates extending the openings 432 through the ARC layer 420 and the dielectric layer 418 to expose portions of the ARC layer 416. In an embodiment, the openings 432 are extended through the ARC layer 420 and the dielectric layer 418 by using an anisotropic dry etch.

FIG. 5D illustrates forming an alignment layer 434 on the ARC layer 420 and in the openings 432. The alignment layer 434 may be formed of a polycrystalline-silicon (poly-Si), poly-crystalline silicon-germanium (poly-SiGe), oxides, nitrides, the like, or a combination thereof. In one embodiment, amorphous silicon is deposited and recrystallized to create polycrystalline silicon (poly-silicon). The alignment layer 434 may be deposited by PVD, CVD, sputter deposition, the like, or a combination thereof. The top surface of the alignment layer 434 may have a non-planar top surface, and may be planarized by, for example, a CMP process.

FIG. 5E illustrates the thinning of the alignment layer 434 and the removal of the ARC layer 420 and the dielectric layer 418 to form alignment structures 436. The thinning and removal steps may include a CMP process, an etch process, the like, or a combination thereof. In embodiment, each of the alignment structures 436 is aligned with a gate 404 in layers below the respective alignment structure 436.

FIG. 5F illustrates the formation of alignment spacers 438 on the sidewalls of the alignment structures 436. The alignment spacers 438 may be formed of similar materials and by similar processes as the alignment spacers 114 described above the description is not repeated herein.

FIG. 5G illustrates the formation of dielectric layer 440, hardmask layer 442, and photoresist 444 over the alignment structures 436 with openings 446 formed in the photoresist 444. The openings 446 are aligned between the alignment structures 436. FIG. 5G illustrates extending the openings 446 through the hardmask layer 442, the dielectric layer 440, and the ARC layer 416 to portions of the top surface 414A of the hardmask layer 414.

FIG. 5I illustrates the formation of dielectric layer 448, hardmask layer 450, and photoresist 452 over the alignment structures 436 and in the openings 446 and the formation of an opening 454 formed in the photoresist 452. The opening 446 is aligned adjacent an alignment structures 436 and between gates 404. FIG. 5J illustrates extending the opening 454 through the hardmask layer 450, the dielectric layer 448, and the ARC layer 416 to expose portions of the top surface 414A of the hardmask layer 414.

FIG. 5K illustrates removing the dielectric layer 448 to expose the alignment structures 436 and the ARC layer 416. FIG. 5L illustrate extending the openings 446 and 454 to form openings 456 through the hardmask layer 414, the ARC layer 412, and the ILD 410 to expose portions of the top surface 402A of the substrate 402. FIG. 5M illustrates forming a conductive layer 458 in the openings 456 and over the alignment structures 436 and the ARC layer 416. The conductive layer 458 may be formed of similar materials and by similar processes as the conductive layer 122 described above and the description is not repeated herein.

FIG. 5N illustrates the recessing of the conductive layer 458 and removing the alignment structures 436 to expose the top surface 416A of the ARC layer 416 between the alignment spacers 438. The alignment structures 436 may be removed by a wet etch process that is selective to the alignment structures 436.

FIG. 5O illustrates forming openings 460 through the ARC layer 416, the hardmask layer 414, the ARC layer 412, and partially through the ILD 410 to expose the top surfaces 406A of the hard masks 406. The openings 460 may be formed by using acceptable photolithography and etching techniques such as, for example, an anisotropic dry etch.

FIG. 5P illustrates extending the openings 460 through the hard masks 406 to expose top surfaces 404A of the gates 104. The openings 460 may be extended through the hard masks 406 by using acceptable photolithography and etching techniques such as, for example, an anisotropic dry etch.

FIG. 5Q illustrates removing the conductive layer 458 from the openings 456 to expose the portions of the top surface 402A of the substrate 402 in the openings 456. The conductive layer 458 may be removed by a wet etch process that is selective to the conductive layer 458.

FIG. 5R illustrates forming a conductive layer 462 in the openings 456 and 460. FIG. 5S illustrates recessing the conductive layer 462 to form conductive features 464 in the openings 460 contacting the top surfaces 404A of the gates 404 and conductive features 466 in the openings 456 contacting the top surface 402A of the substrate 402. In an embodiment, the recessing is performed by a dry etch process with a plasma source and an etchant gas such as $H_2$, $NH_3$, Ar, He, the like, or a combination thereof.

FIG. 5T illustrates removing the alignment spacers 438, the ARC layers 416 and 412, and the hardmask layer 414 and the planarization of the ILD 510 and the conductive features 466 and 464. The planarization process may be a CMP process, an etch process, the like, or a combination thereof. In some embodiments, the top surfaces 466A of the conductive features 466, the top surfaces 464A of conductive features 464, and the top surface 410A of the ILD 410 are substantially coplanar after the planarization process. The conductive features 464 may be used as contacts to couple the gates 404 to layers above the ILD 410 and the conductive features 466 may be used as contacts to couple the substrate 402 and devices and metallization layers formed therein to layers above ILD 410.

Figure 6A:
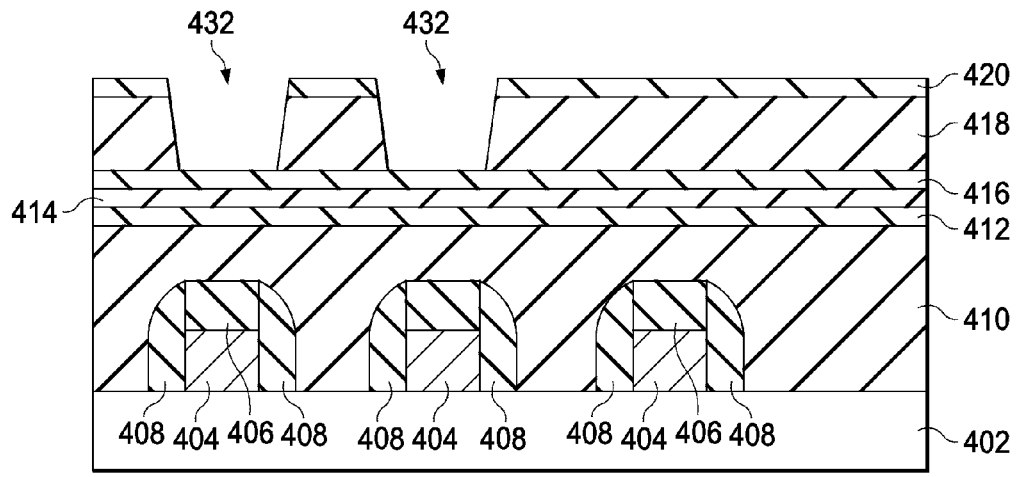
FIGS. 6A through 6X illustrate cross-sectional views of intermediate stages in the manufacturing of a semiconductor device in accordance with an embodiment.
Figure 6B:
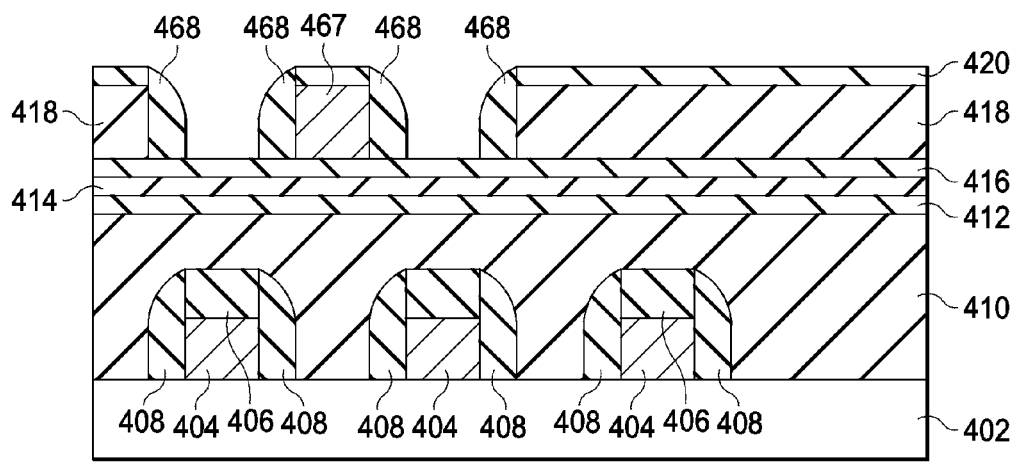
Figure 6C:
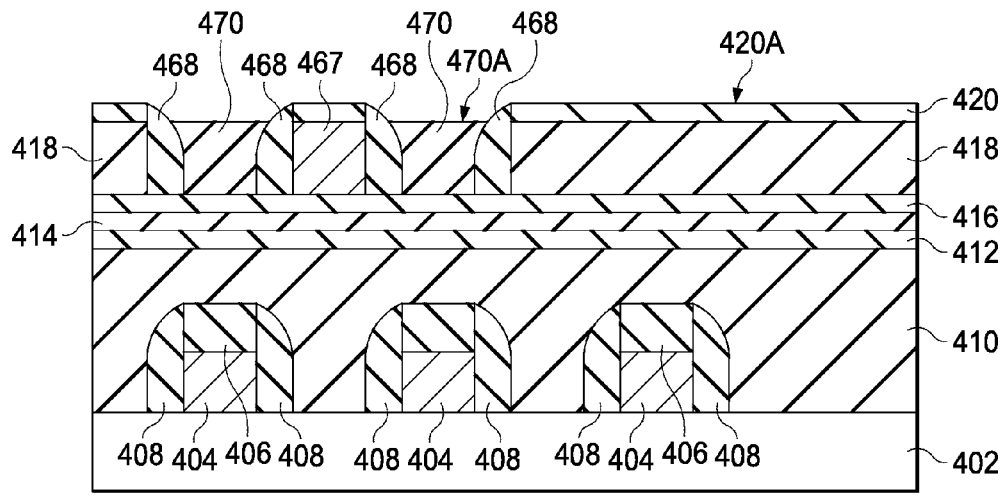
Figure 6D:
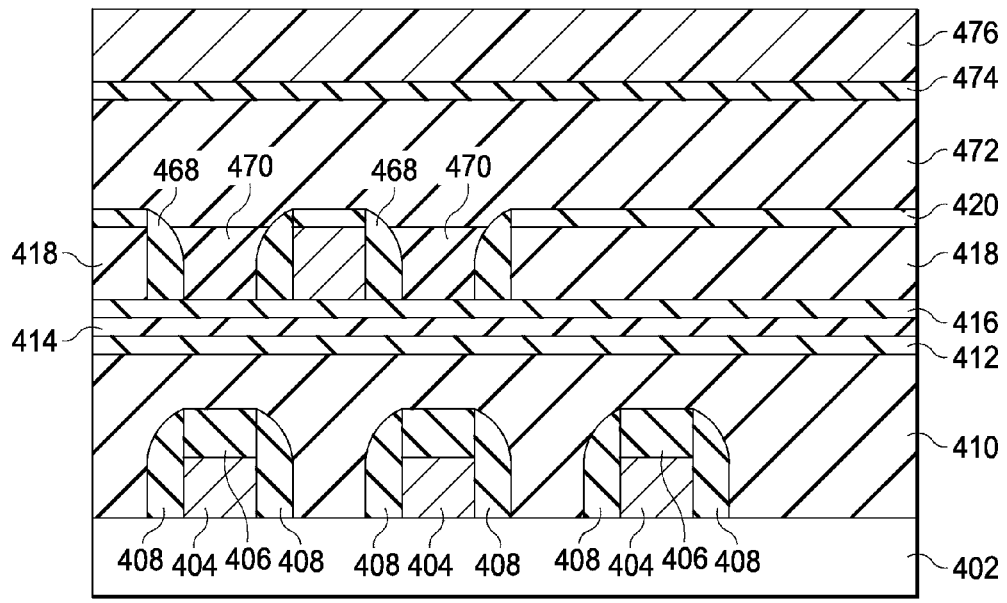
Figure 6E:
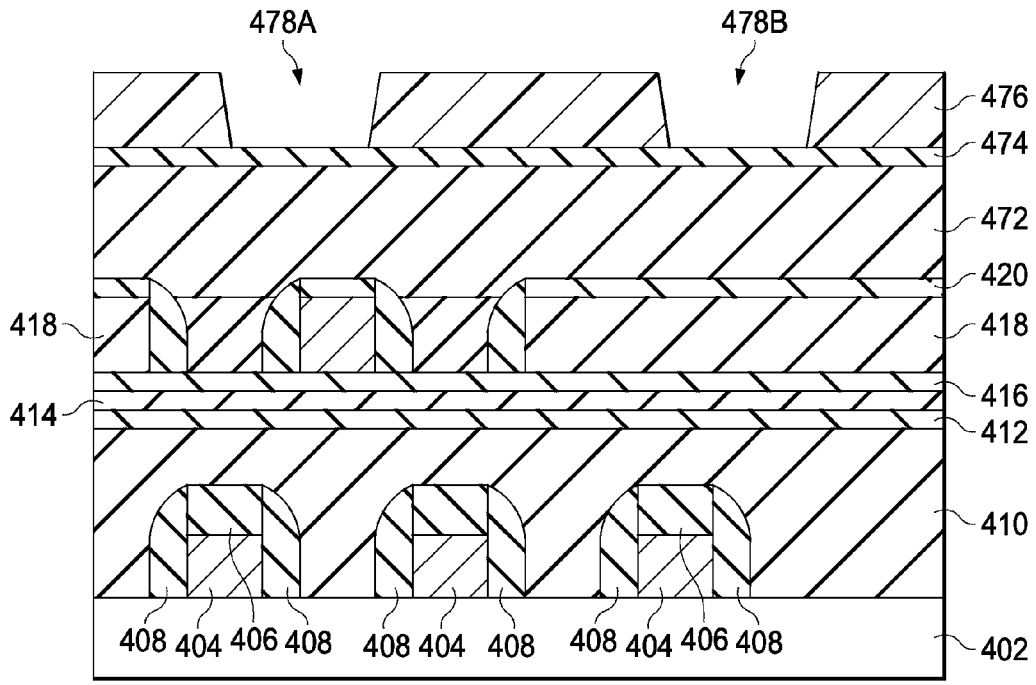
Figure 6F:
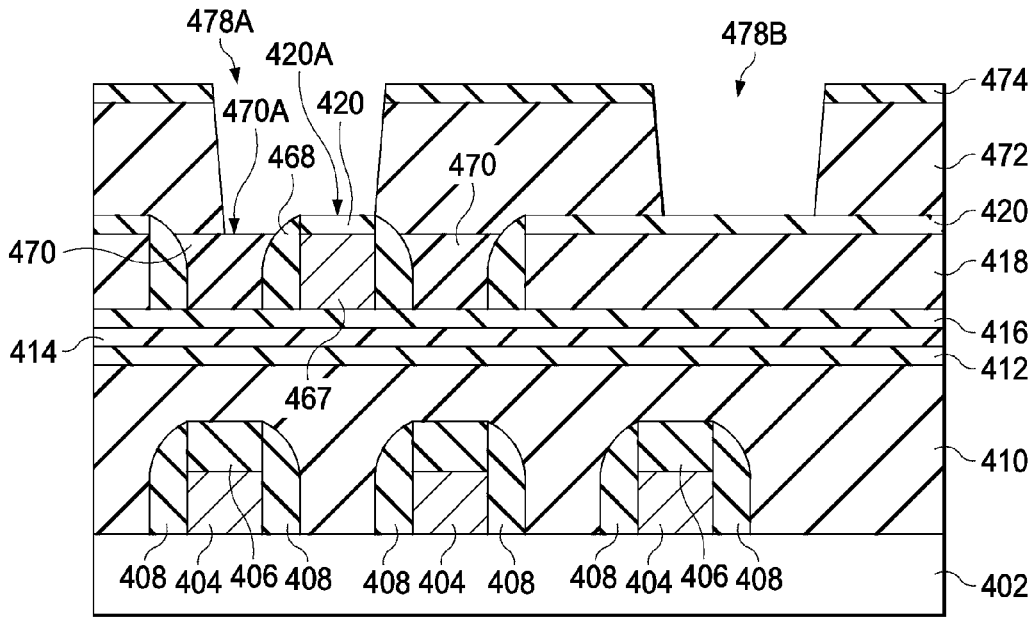
Figure 6G:
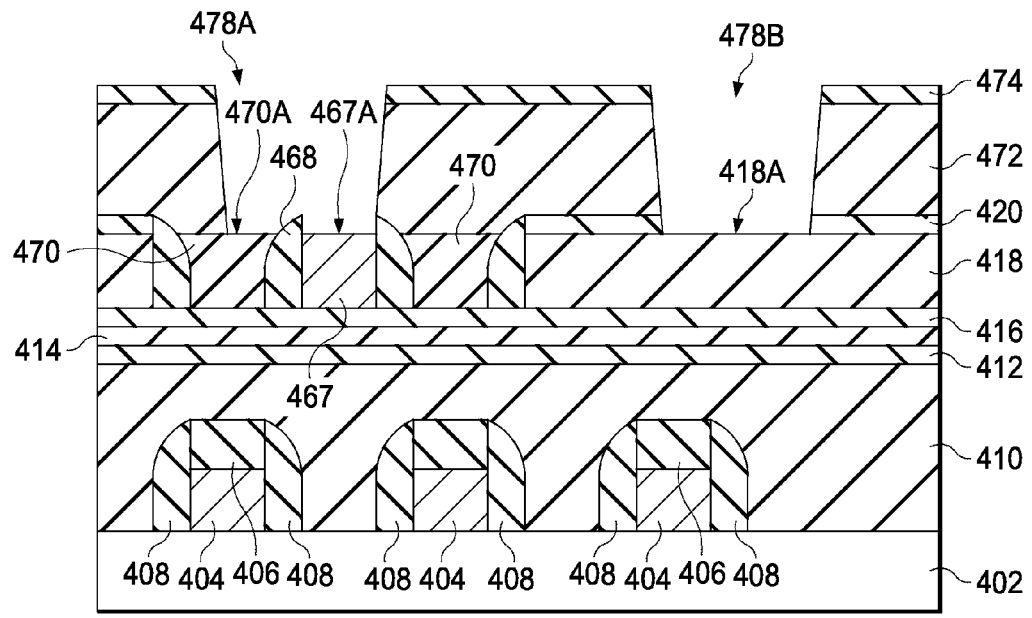
Figure 6H:
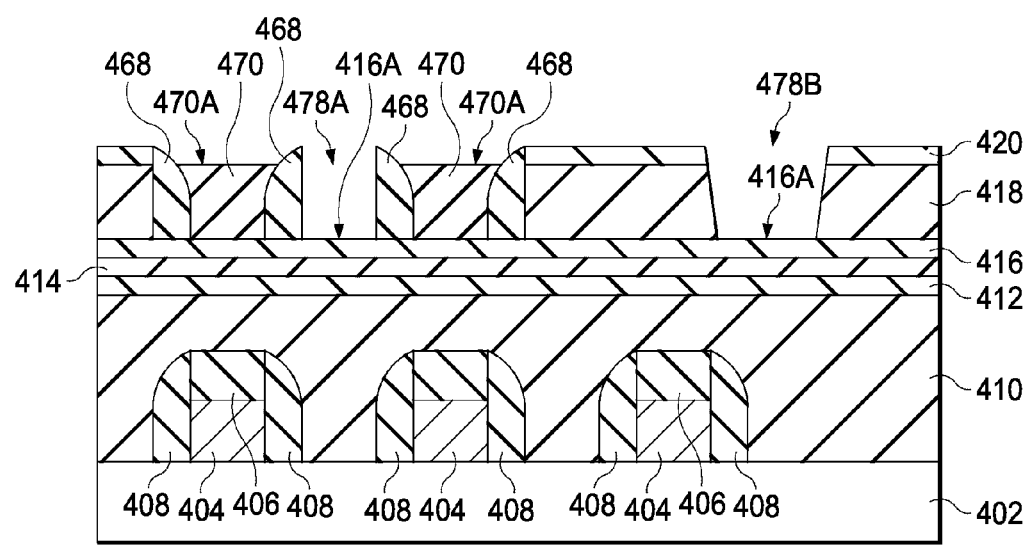
Figure 6I:
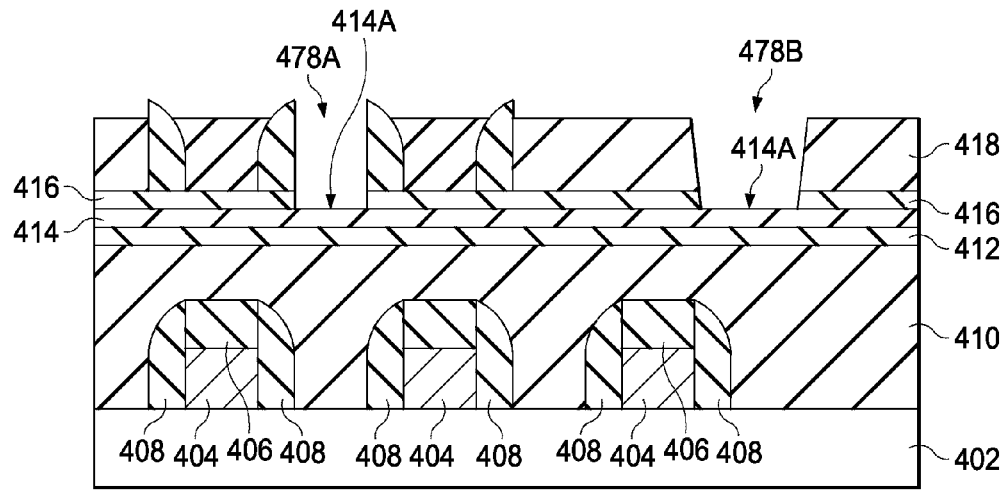
Figure 6J:
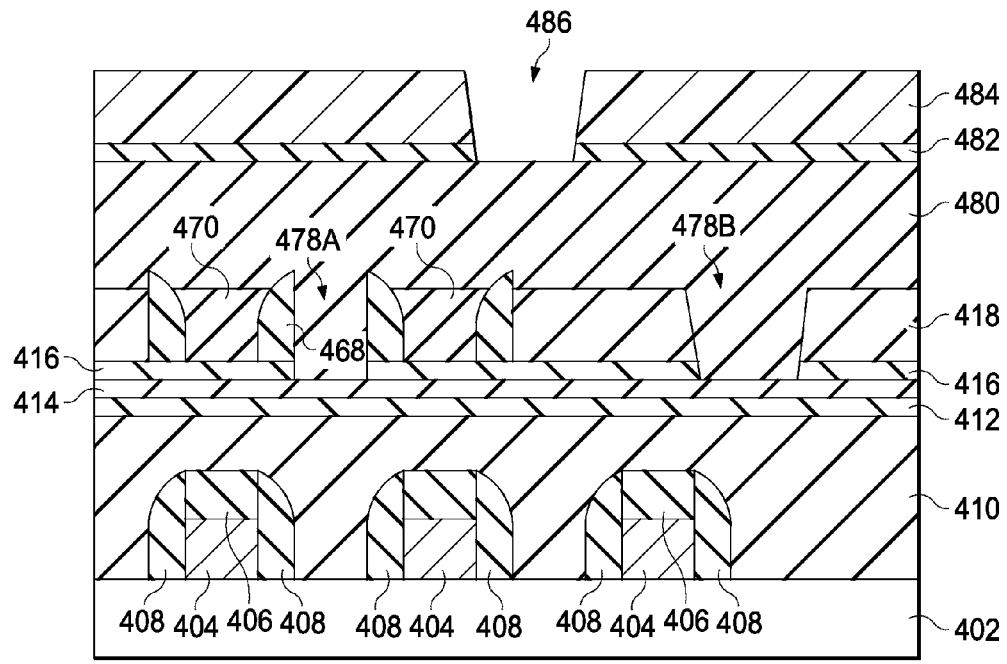
Figure 6K:
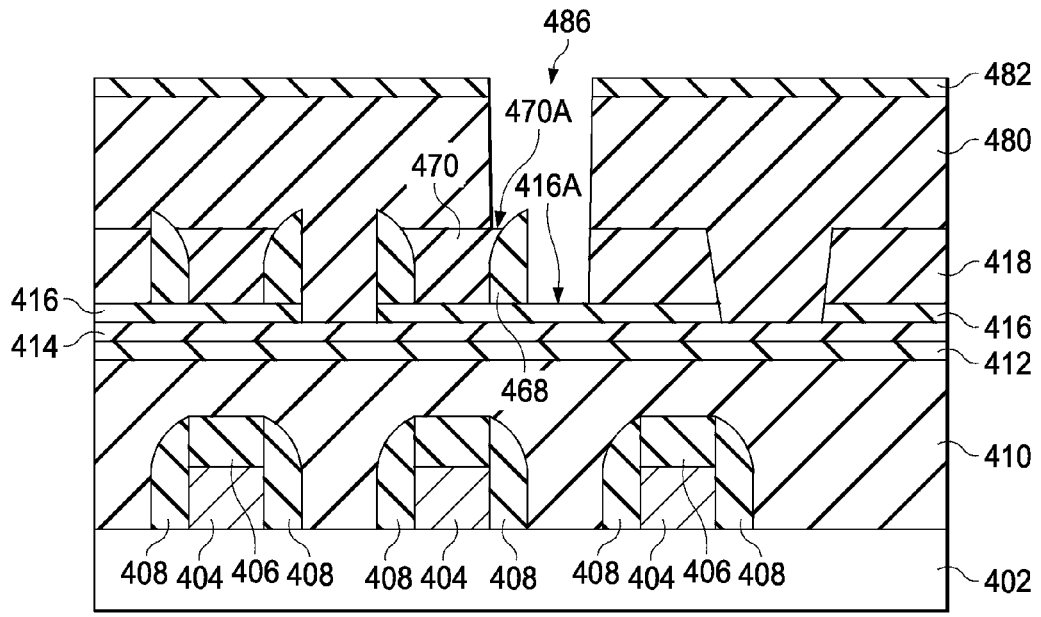
Figure 6L:
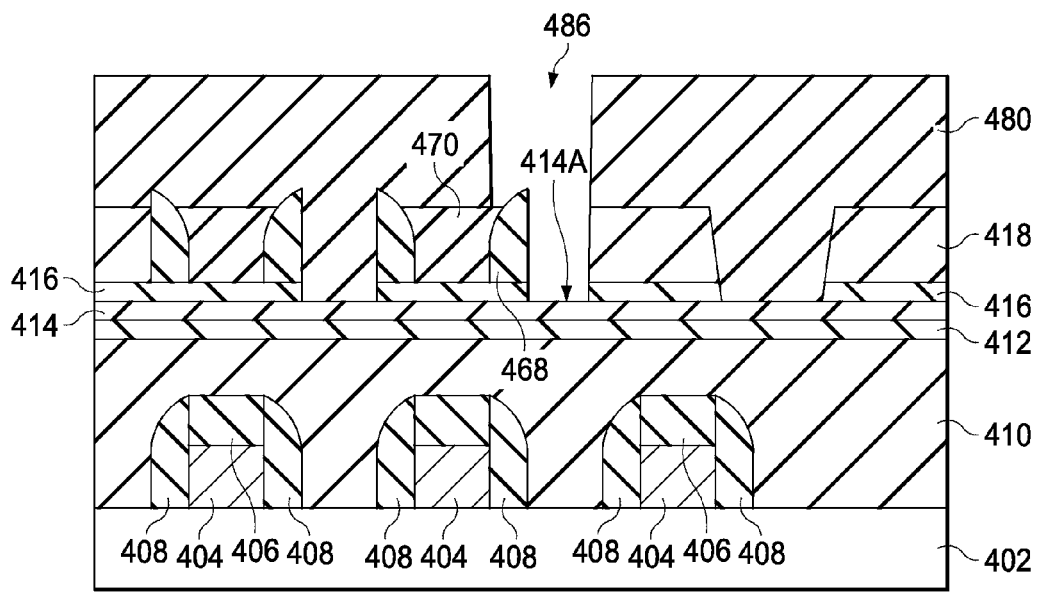
Figure 6M:
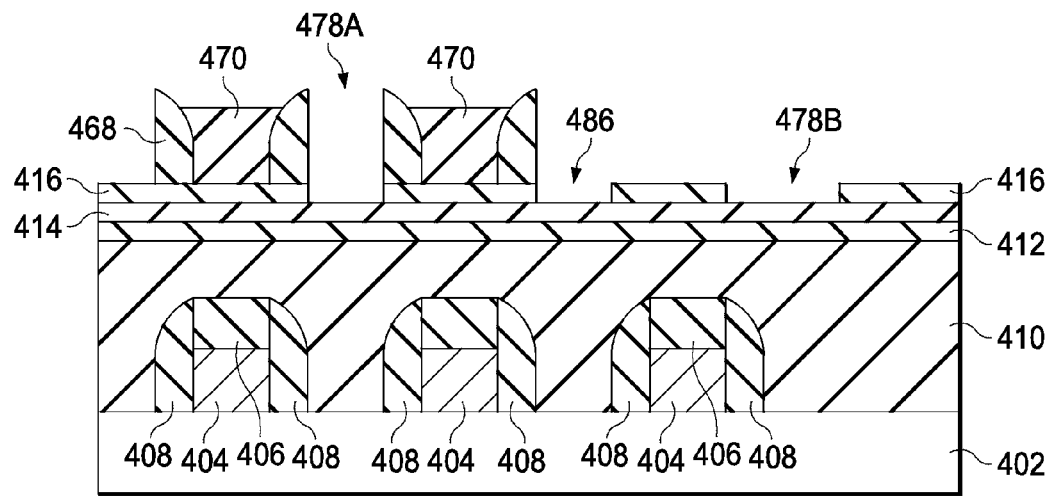
Figure 6N:
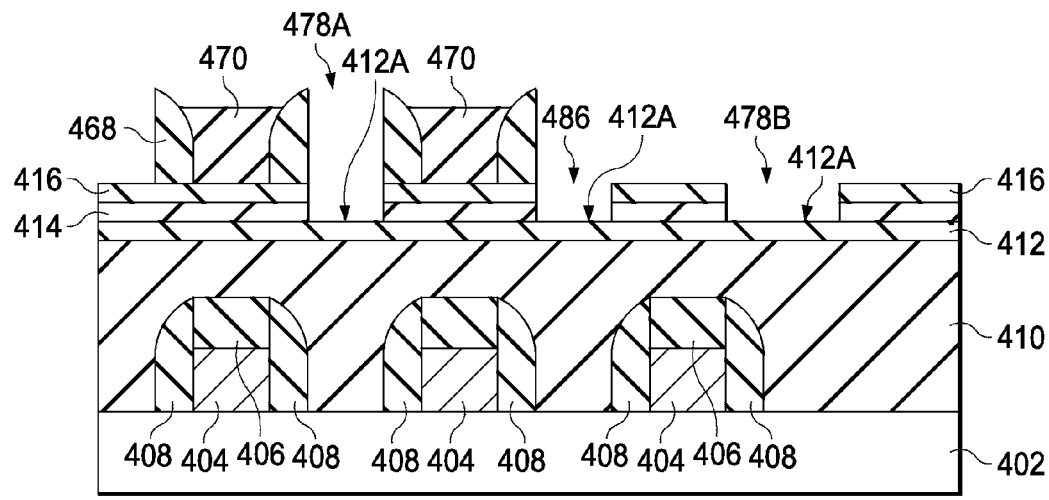
Figure 6O:
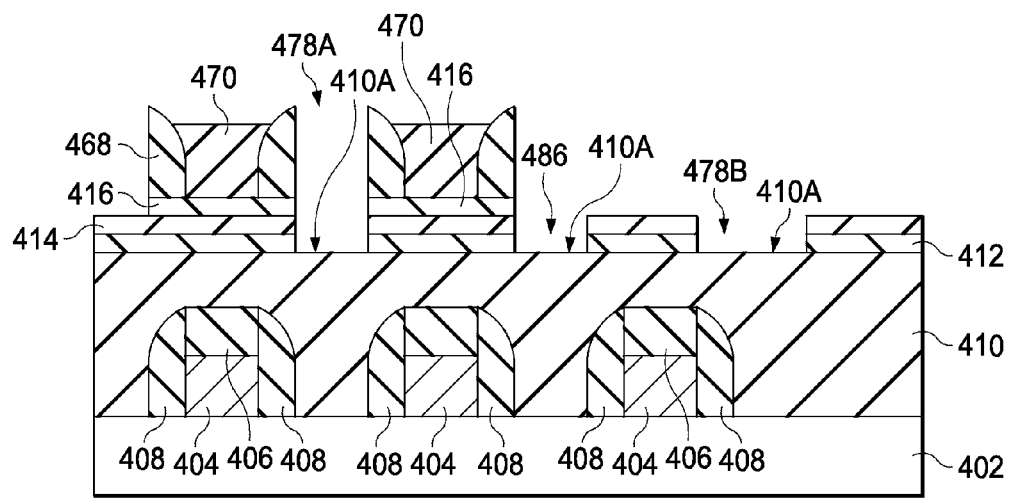
Figure 6P:
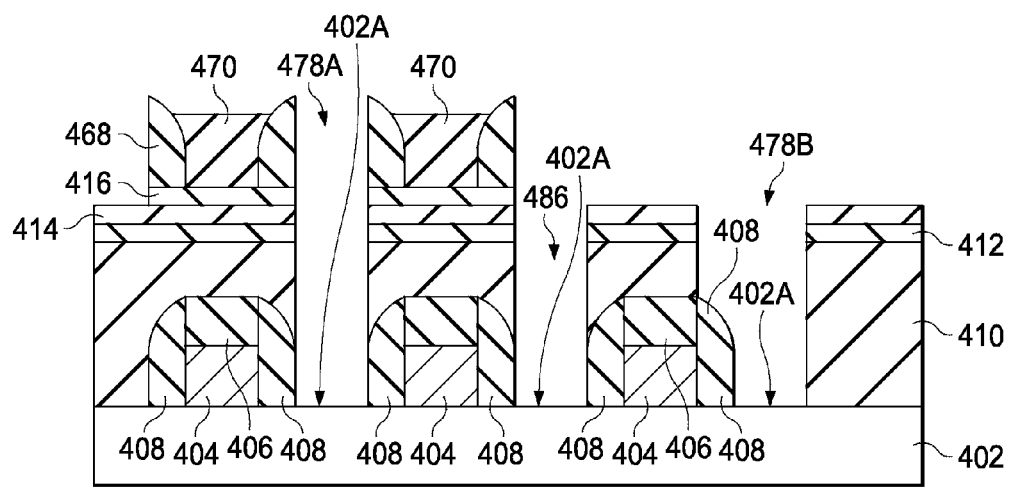
Figure 6Q:
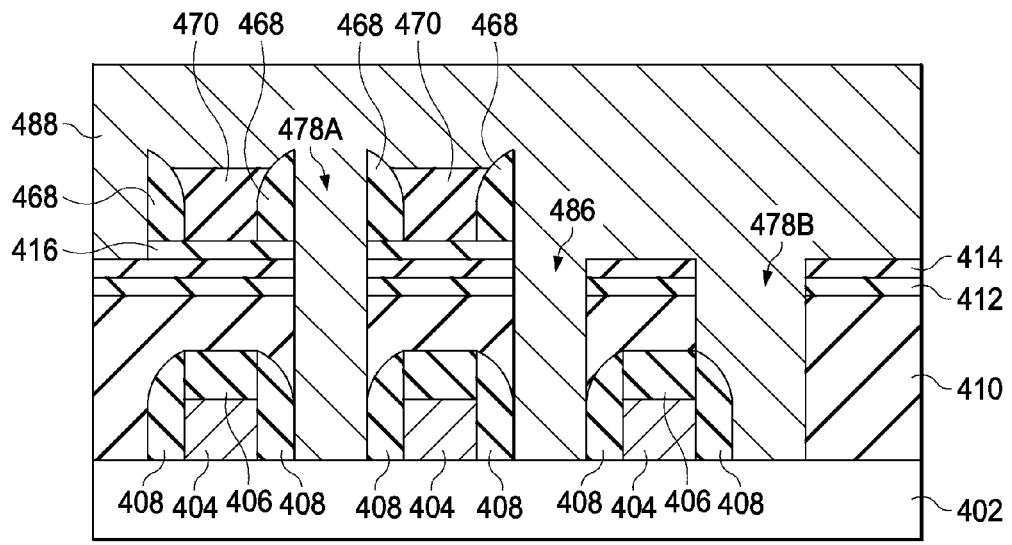
Figure 6R:
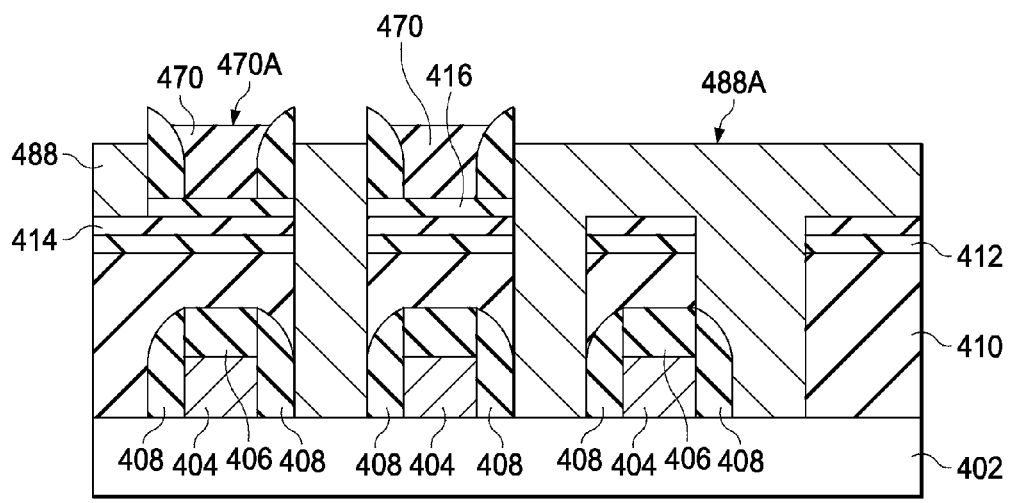
Figure 6S:
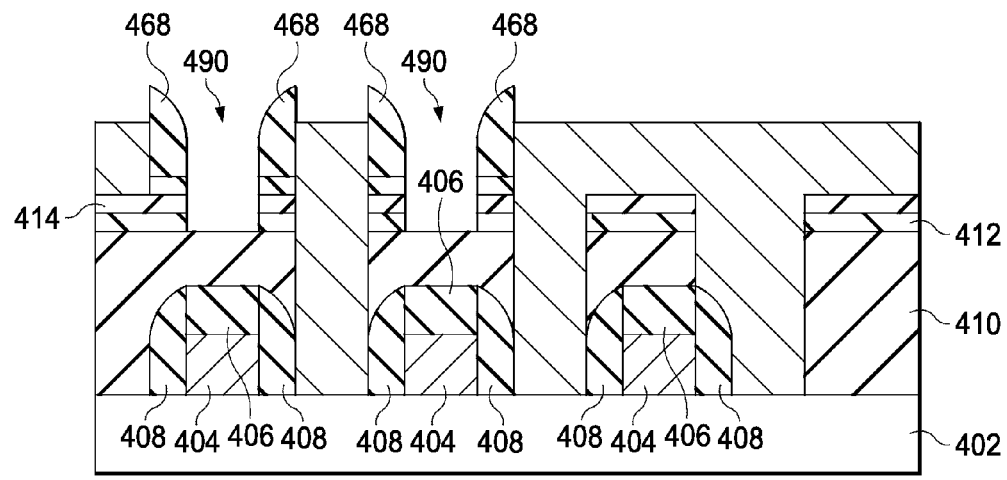
Figure 6T:
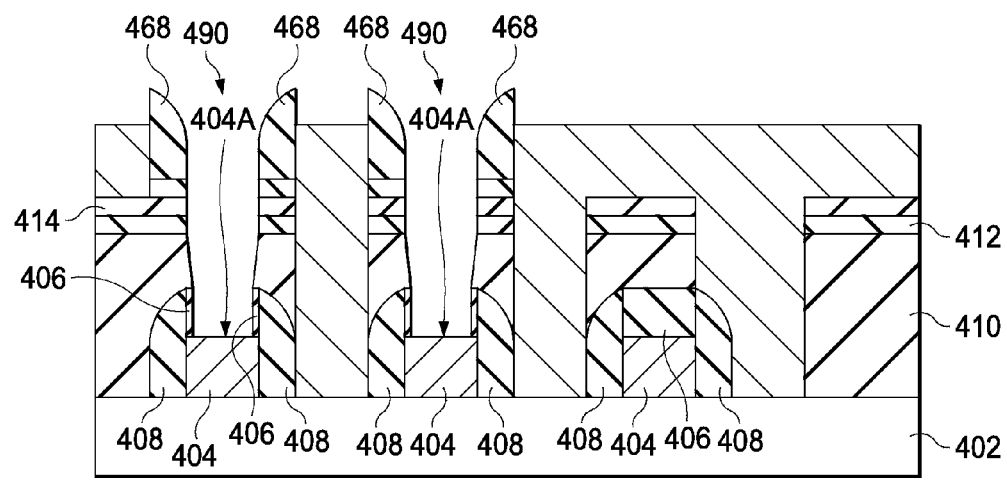
Figure 6U:
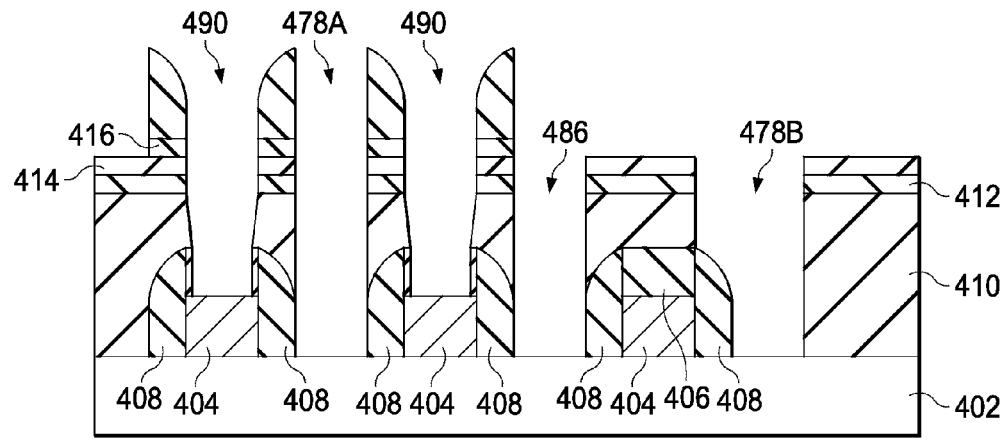
Figure 6V:
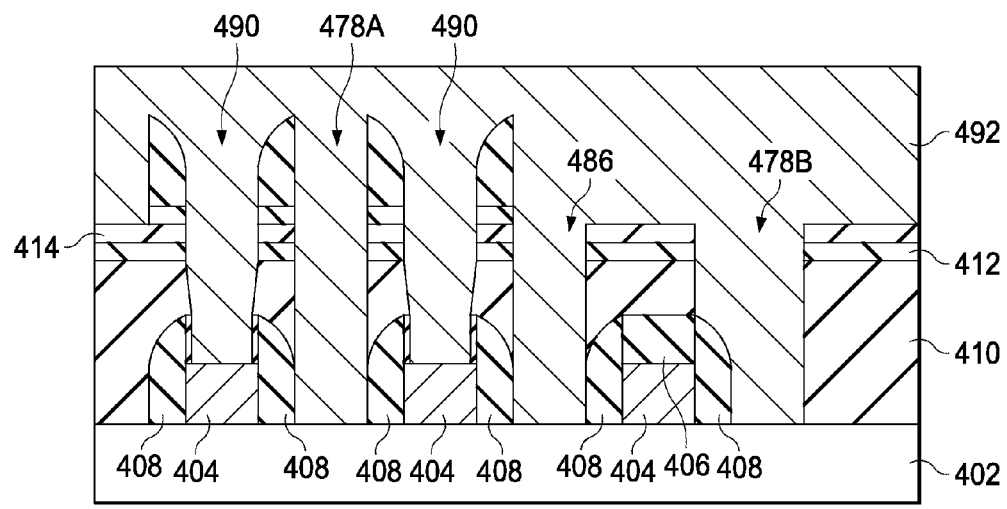
Figure 6W:
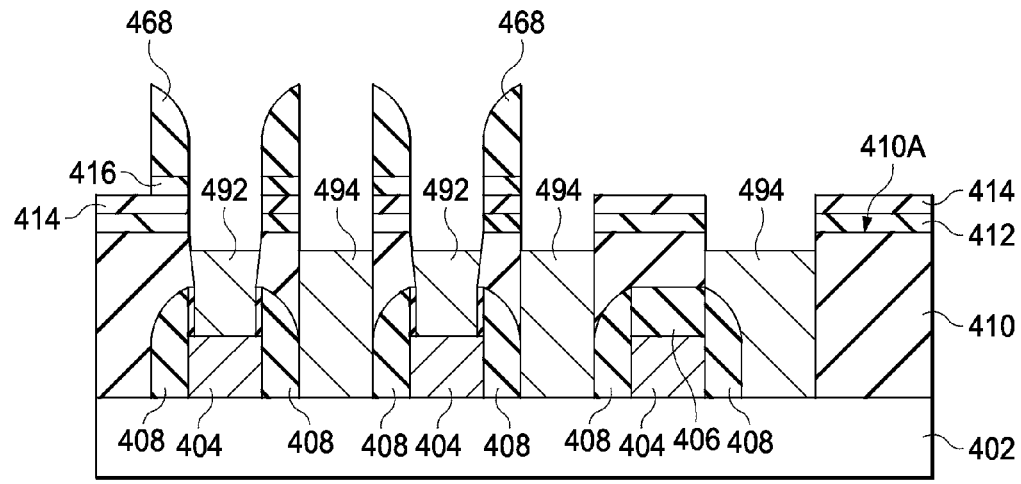
Figure 6X:
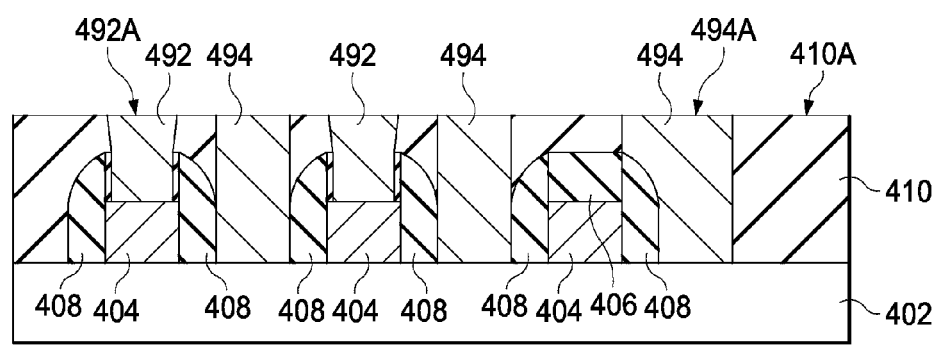

FIGS. 6A through 6X illustrate cross-sectional views of intermediate stages in the manufacturing of a semiconductor device in accordance with an embodiment. Details regarding this embodiment that are similar to those for the previously described embodiment will not be repeated herein.

FIG. 6A illustrates an intermediate stage of manufacture of a semiconductor device similar to FIG. 5C described above and the description is not repeated herein.

FIG. 6B illustrates the formation of alignment spacers 468 inside the openings 432. The alignment spacers 468 may be formed similar to the alignment spacers 114 described above and the description is not repeated herein. In this embodiment, the alignment spacers 468 are formed on the sidewalls of openings, whereas in the previous embodiments, the alignment spacers were formed on sidewalls of a structure (e.g. an alignment structure). By forming the alignment spacers 468 in the openings 432, a portion of the dielectric layer 418 between the openings 432 forms an alignment structure 467.

FIG. 6C illustrates forming an alignment structure 470 between the alignment spacers 468. The alignment structures 470 are formed after the alignment spacers 468 and are referred to as secondary alignment structures 470 with the alignment structure 467 being a primary alignment structure 467. The secondary alignment structures 470 may be formed of a polycrystalline-silicon (poly-Si), poly-crystalline silicon-germanium (poly-SiGe), oxides, nitrides, the like, or a combination thereof. In one embodiment, amorphous silicon is deposited and recrystallized to create polycrystalline silicon (poly-silicon). The secondary alignment structures 470 may be deposited by PVD, CVD, sputter deposition, the like, or a combination thereof. In an embodiment, the top surfaces 470A of the secondary alignment structures 470 are recessed by an etching process to make the top surfaces 470A lower than the top surface 420A of the ARC layer 420.

FIG. 6D illustrates the formation of a dielectric layer 472, a hardmask layer 474, and a photoresist 476 over the primary alignment structure 467, the secondary alignment structures 470, and the ARC layer 420. FIG. 6E illustrates the formation of openings 478A and 478B in the photoresist 476 with opening the 478A aligned over a portion of a secondary alignment structure 470 and a portion over the primary alignment structure 467. The opening 478B is aligned adjacent one of the gates 404.

FIG. 6F illustrates extending the openings 478A and 478B through the hardmask layer 474 and the dielectric layer 472 to expose portions of the top surfaces 420A of the ARC layer 420, a portion of the top surface 470A of the secondary alignment structure 470, and a portion of an alignment spacer 468. In an embodiment, both the openings 478A and 478B expose a portion of the top surface 420A of the ARC layer 420.

FIG. 6G illustrates extending the openings 478A and 478B through the ARC layer 420 to expose a top surface 467A of the primary alignment structure 467 and a portion of the top surface 418A of the dielectric layer 418. FIG. 6H illustrates removing the hardmask layer 474, the dielectric layer 472, and the primary alignment structure 467 and extending the openings 478A and 478B through the dielectric layer 418. In this embodiment, the opening 478A extends between a pair of alignment spacers 468 to expose a top surface 416A of the ARC layer 416.

FIG. 6I illustrates extending the openings 478A and 478B through the ARC layer 416 to expose portions of the top surface 414A of the hardmask layer 414. FIG. 6J illustrates the formation of a dielectric layer 480, a hardmask layer 482, and a photoresist in the openings 478A and 478B and over the secondary alignment structures 470 and the dielectric layer 418. An opening 486 is formed in the photoresist 484 with opening 486 aligned over a portion of a secondary alignment structure 470.

FIG. 6K illustrates extending the opening 486 through the hardmask layer 482 and the dielectric layer 480 to expose portions of the top surfaces 416A of the ARC layer 416, a portion of the top surface 470A of a secondary alignment structure 470, and a portion of an alignment spacer 468. FIG. 6L illustrates extending the opening 486 through the ARC layer 416 to expose portions of the top surface 414A of the hardmask layer 414. FIG. 6M illustrates removing the dielectric layer 480 and the dielectric layer 418.

FIG. 6N illustrates extending the openings 478A, 478B, and 486 through the hardmask layer 414 to expose portions of the top surface 412A of the ARC layer 412. FIG. 6O illustrates extending the openings 478A, 478B, and 486 through the ARC layer 412 to expose portions of the top surface 410A of the ILD 410.

FIG. 6P illustrates extending the openings 478A, 478B, and 486 through the ILD 410 to expose portions of the top surface 402A of the substrate 402. FIG. 6Q illustrates forming a conductive layer 488 in the openings 478A, 478B, and 486 and over the secondary alignment structures 470 and the hardmask layer 414. The conductive layer 488 may be formed of similar materials and by similar processes as the conductive layer 122 described above and the description is not repeated herein.

FIG. 6R illustrates the recessing of the conductive layer 488 to have a top surface 488A lower than top surfaces 470A of the secondary alignment structures 470. FIG. 6S illustrates removing the secondary alignment structures 470 to form openings 490. The secondary alignment structures 470 may be removed by a wet etch process that is selective to the secondary alignment structures 470. FIG. 6S also illustrates extending the openings 490 through the ARC layers 416 and 412 and the hardmask layer 414.

FIG. 6T illustrates forming the openings 490 partially through the ILD 410 and through the hardmasks 406 to expose top surfaces 404A of the gates 404. FIG. 6U illustrates removing the conductive layer 488 from the openings 478A, 478B, and 486 to expose the portions of the top surface 402A of the substrate 402 in the openings 478A, 478B, and 486. The conductive layer 488 may be removed by a wet etch process that is selective to the conductive layer 488.

FIG. 6V illustrates forming a conductive layer 492 in the openings 478A, 478B, 486, and 490. FIG. 6W illustrates recessing the conductive layer 492 to form conductive features 492 in the openings 490 contacting the top surfaces 404A of the gates 404 and conductive features 494 in the openings 478A, 478B, and 486 contacting the top surface 402A of the substrate 402. In an embodiment, the recessing is performed by a dry etch process with a plasma source and an etchant gas such as $H_2$, $NH_3$, Ar, He, the like, or a combination thereof.

FIG. 6X illustrates removing the alignment spacers 468, the hardmask layer 414, the ARC layer 412, and the planarization of the ILD 410 and the conductive features 492 and 494. The planarization process may be a CMP process, an etch process, the like, or a combination thereof. In some embodiments, the top surfaces 492A of the conductive features 492, the top surfaces 494A of conductive features 494, and the top surface 410A of the ILD 410 are substantially coplanar after the planarization process. The conductive features 492 may be used as contacts to couple the gates 404 to layers above the ILD 410 and the conductive features 494 may be used as contacts to couple the substrate 402 and devices and metallization layers formed therein to layers above ILD 410.

The embodiments described above provide self-alignment of conductive contacts and conductive lines between two or more layers. The embodiments include alignment structures and alignment spacers on opposite sides of the alignment structures in layers above the gates. The alignment structures and alignment spacers allow for self-alignment between the alignment spacers of a single alignment structure and for self-alignment between alignment spacers of different alignment structures. Further, by having only spacers surrounding the gates in the ILD layer, the ILD layer is able to be kept clean and free from residue from other spacers and/or hard masks as the alignment structures are formed in ILD layer above the ILD layer containing the gates. Also, the process described above allows the conductive features landing on the gates and on the substrate to be self-aligning.

An embodiment is a method for forming a semiconductor device, the method including forming at least two gates over a substrate, and forming at least two alignment structures over the at least two gates. The method further includes forming spacers on opposite sidewalls of the at least two alignment structures, and forming a first opening between a pair of the at least two alignment structures, a portion of the first opening exposing a top surface of at least one of the pair, the first opening extending a first distance from a top surface of the substrate. The method further includes filling the first opening with a first conductive material to form a first conductive feature, forming a second opening between the spacers of at least one of the at least two alignment structures, the second opening extending a second distance from the top surface of the substrate, the second distance being different than the first distance, and filling the second opening with a second conductive material to form a second conductive feature.

Another embodiment is a method of forming a semiconductor device, the method including forming a plurality of gates over a semiconductor substrate, forming a first interlayer dielectric (ILD) over the plurality of gates, and forming at least two alignment structures over the first ILD. The method further includes forming a second ILD over the at least two alignment structures, forming a first set of conductive contacts through the first and second ILDs to a top surface of the semiconductor substrate, one of the at least two alignment structures being between an adjacent pair of the first set of conductive contacts, and forming a second set of conductive contacts through the second ILD and partially through the first ILD to the plurality of gates, at least one of the second set of contacts extending through one of the alignment structures.

Yet another embodiment is a method of forming a semiconductor device, the method including forming a plurality of gates on a substrate, forming an inter-layer dielectric (ILD) over the plurality of gates, and forming a first dielectric layer over the ILD. The method further includes forming a first and a second opening in the first dielectric layer, a portion of the first dielectric layer between the first and the second opening forming a primary alignment structure, and forming secondary alignment structures inside the first and second openings. The method further includes forming a first contact through the primary alignment structure and the ILD to a top surface of the substrate, and forming a second contact through one of the secondary alignment structures to a top surface of one of the plurality of gates.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A structure comprising:
   a first gate and a second gate over a substrate, the first and second gates each comprising a gate electrode, a hard mask over the gate electrode, and spacers on opposing sidewalls of the gate electrode and hard mask;
   an interlayer dielectric (ILD) over the first and second gates and the substrate, the ILD having a top surface, the top surface of the ILD being substantially planar; and
   a first contact extending from the top surface of the ILD to contact the gate electrode of the first gate, the first contact having tapered sidewalls in the ILD and substantially parallel sidewalls in the hard mask of the first gate.

2. The structure of claim 1 further comprising:
   a second contact extending from the top surface of the ILD to contact a first portion of the substrate.

3. The structure of claim 2, wherein the second contact has tapered sidewalls from the top surface the ILD to the first portion of the substrate.

4. The structure of claim 2, wherein the first portion of the substrate is between the first and second gates.

5. The structure of claim 2, wherein the first portion of the substrate comprises a source/drain region.

6. The structure of claim 2, wherein top surfaces of the first and second contacts are substantially coplanar with the top surface of the ILD.

7. The structure of claim 2 further comprising:
   a third contact extending from the top surface of the ILD to contact the gate electrode of the second gate, the third contact having tapered sidewalls in the ILD and substantially parallel sidewalls in the hard mask of the second gate.

8. The structure of claim 2 further comprising:
   a third contact extending from the top surface of the ILD to contact the gate electrode of the second gate, the first contact being separated from the second contact by a first width at the top surface of the ILD, the second contact being separated from the third contact by the first width at the top surface of the ILD.

9. The structure of claim 1 further comprising:
   a third gate the substrate, the third gate comprising a gate electrode, a hard mask over the gate electrode, and spacers on opposing sidewalls of the gate electrode and hard mask; and a fourth contact over the third gate and contacting the hard mask and gate spacers of the third gate, the fourth contact contacting the substrate on at least two sides of the third gate.

10. The structure of claim 9, wherein the third gate is embedded within the fourth contact.

11. A structure comprising:
a first gate structure over a substrate, the first gate structure comprising first gate spacers on opposing sidewalls of a first gate stack;
a second gate structure over the substrate, the second gate structure comprising second gate spacers on opposing sidewalls of a second gate stack;
an interlayer dielectric (ILD) over the first and second gate structures and the substrate;
a first conductive feature extending from a top surface of the ILD and partially through the first gate stack of the first gate structure; and
a second conductive feature extending from the top surface of the ILD to contact the substrate on at least two sides of the second gate structure.

12. The structure of claim 11, wherein the second gate structure is embedded within the second conductive feature.

13. The structure of claim 11 further comprising:
a third gate structure over the substrate, the third gate structure comprising third gate spacers on opposing sidewalls of a third gate stack, the third gate structure being between the second conductive feature and the first gate structure; and
a third conductive feature extending from the top surface of the ILD to contact the substrate between the first and second gate structures.

14. The structure of claim 13, wherein the first gate stack is separated from the third gate stack by a first width, and wherein the first conductive feature is separated from the third conductive feature by a second width at the top surface of the ILD, the second width being from about 10% to about 40% of the first width.

15. The structure of claim 11, wherein the first conductive feature has tapered sidewalls in the ILD and substantially parallel sidewalls in the first gate stack.

16. A method comprising:
forming gates over a substrate;
forming alignment structures over the gates;
forming spacers on sidewalls of the alignment structures;
forming a first conductive feature between a pair of the alignment structures, the first conductive feature having a first bottom surface proximate the substrate and a first top surface distal the substrate; and
forming a second conductive feature between the spacers of at least one of the alignment structures, the second conductive feature having a second bottom surface proximate the substrate and a second top surface distal the substrate, the first and second top surfaces being substantially coplanar, the first and second bottom surfaces being in different planes.

17. The method of claim 16 further comprising:
forming a first dielectric layer over the gates, the alignment structures being formed on a top surface of the first dielectric layer; and
forming a second dielectric layer over the alignment structures.

18. The method of claim 17 further comprising:
removing the alignment structures;
removing the second dielectric layer; and
planarizing the top surfaces of the first dielectric layer and the first and second conductive features, the top surfaces of the first dielectric layer and the first and second conductive features being substantially coplanar.

19. The method of claim 16, wherein one of the first and second conductive features is electrically and physically coupled to one of the gates, and wherein the other one of the first and second conductive features is electrically and physically coupled to a surface of the substrate.

20. The method of claim 16, wherein the alignment structures are aligned with the gates.

* * * * *